(12) United States Patent
Isodono et al.

(10) Patent No.: US 7,043,675 B2
(45) Date of Patent: May 9, 2006

(54) LOGIC CIRCUIT TEST APPARATUS AND LOGIC CIRCUIT TEST METHOD

(75) Inventors: Koji Isodono, Kashiba (JP); Hideyuki Ichihara, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 390 days.

(21) Appl. No.: 10/668,370

(22) Filed: Sep. 24, 2003

(65) Prior Publication Data

US 2004/0093542 A1    May 13, 2004

(30) Foreign Application Priority Data

Sep. 27, 2002   (JP)   ............... 2002-284340

(51) Int. Cl.
*G01R 31/28* (2006.01)

(52) U.S. Cl. ...................... 714/738; 324/538
(58) Field of Classification Search ................ 714/724, 714/700, 738; 324/761, 765, 158.1, 538
See application file for complete search history.

(56) References Cited

U.S. PATENT DOCUMENTS

| | | | | |
|---|---|---|---|---|
| 5,226,048 A | * | 7/1993 | Bandali et al. | 714/724 |
| 5,764,069 A | * | 6/1998 | Cugini | 324/761 |
| 6,275,962 B1 | * | 8/2001 | Fuller et al. | 714/724 |
| 6,407,572 B1 | * | 6/2002 | Kanase et al. | 324/765 |
| 6,587,976 B1 | * | 7/2003 | Yun et al. | 714/700 |
| 6,794,861 B1 | * | 9/2004 | Maassen et al. | 324/158.1 |

FOREIGN PATENT DOCUMENTS

| | | |
|---|---|---|
| JP | 10-132902(1998) | 5/1998 |
| JP | 11-317671(1999) | 11/1999 |
| WO | 98/43359 | 10/1998 |

OTHER PUBLICATIONS

K. Chakrabarty, B..T. Murray, J. Liu and M. Zhu, "Test Width Compression for Built-in Self Testing", Proceedings International Test Conference, IEEE Computer Society, p. 328-337, 1997.

* cited by examiner

*Primary Examiner*—David Ton
(74) *Attorney, Agent, or Firm*—Nixon & Vanderhye, P.C.

(57) ABSTRACT

A logic circuit test apparatus for testing a logic circuit having a plurality of input terminals and a plurality of output terminals, the logic circuit test apparatus including: a common test signal generating circuit which groups the input terminals of the logic circuit on the basis of logic states of original test signals to be applied to the respective input terminals of the logic circuit and outputs common test signals from common test signal output terminals thereof smaller in number than the input terminals of the logic circuit; and an input connection switching circuit which switches connections of the common test signal output terminals of the common test signal generating circuit with the input terminals of the logic circuit so as to convert the common test signals into the original test signals and apply the original test signals to the respective input terminals of the logic circuit.

12 Claims, 20 Drawing Sheets

Fig. 4

| Cycle | Grouping state (n: Group number, N: Common target terminal number=3) | | | | | n |
|---|---|---|---|---|---|---|
| Ts0 | Gr1 ch1,7 | | Gr0 ch2,3,4,5,6,8 | | | 2 |
| Ts1 | Gr10 ch1,7 | Gr11 ∅ | Gr00 ch2,3,4,6 | Gr01 ch5,8 | | 3 |
| Ts2 | Gr100 ch1,7 | Gr101 ∅ | Gr001 ch2,3,4,6 | Gr000 ∅ | Gr011 ch5,8 | Gr010 ∅ | 3 |
| Ts3 | Gr1001 ch1,7 | Gr1000 ∅ | Gr0011 ch2,4,6 | Gr0010 ch3 | Gr0110 ch5 | Gr0111 ch8 | 5 |

∅ : Null set

Grouping information provided in cycle period Ts2 immediately before cycle period Ts3 in which group number n exceeds common target terminal number N=3.
Gr100 (ch1, ch7) for Tch1
Gr001 (ch2, ch3, ch4, ch6) for Tch2
Gr011 (ch5, ch8) for Tch3

*Fig.8* ch: Imput terminal  CH: Inverted input terminal

| Cycle | Grouping state (n: Group number, N: Common target terminal number=6) | | | | | | | | | n |
|---|---|---|---|---|---|---|---|---|---|---|
| Ts0 | Gr | | | | | | | | | 2 |
| | ch1,7, CH2,3,4,5,6,8 | | | | | | | | | |
| Ts1 | Gr1 | | | | | Gr0 | | | | 4 |
| | ch1,7, CH2,3,4,5,6,8 | | | | | ch2,3,4,5,6,8, CH1,7 | | | | |
| Ts2 | Gr10 | | Gr11 | | Gr00 | | Gr01 | | | 4 |
| | ch1,7, CH5,8 | | CH2,3,4,6 | | ch2,3,4,6 | | ch5,8,CH1,7 | | | |
| | | | | | | | | | | |
| Ts3 | Gr100 | Gr101 | Gr111 | Gr110 | Gr001 | Gr000 | Gr011 | Gr010 | | 8 |
| | ch1,7 | ∅ | ∅ | ch2,3,4,6 | ch2,3,4,6 | ∅ | ch5,8 | ∅ | | |
| | CH5,8 | | CH2,3,4,6 | | | | CH1,7 | | | |
| | Gr1001 | Gr1000 | Gr1101 | Gr1100 | Gr0011 | Gr0010 | Gr0110 | Gr0111 | | 8 |
| | ch1,7 | ch5 | ch8 | CH3 | ch2,4,6 | ch3 | ch5 | ch8 | | |
| | CH5 | CH8 | | CH2,4,6 | | | CH1,7 | | | |

∅ : Null set

Grouping information provided in cycle period Ts2
immediately before cycle period Ts3 in which group number n exceeds
common target terminal number N=6.
Gr100 (ch1, ch7, CH5, CH8) equivalent to Gr011 (ch5, ch8, CH1, CH7) for Tch1
Gr110 (CH2, CH3, CH4, CH6) equivalent to Gr001 (ch2, ch3, ch4, ch6) for Tch2

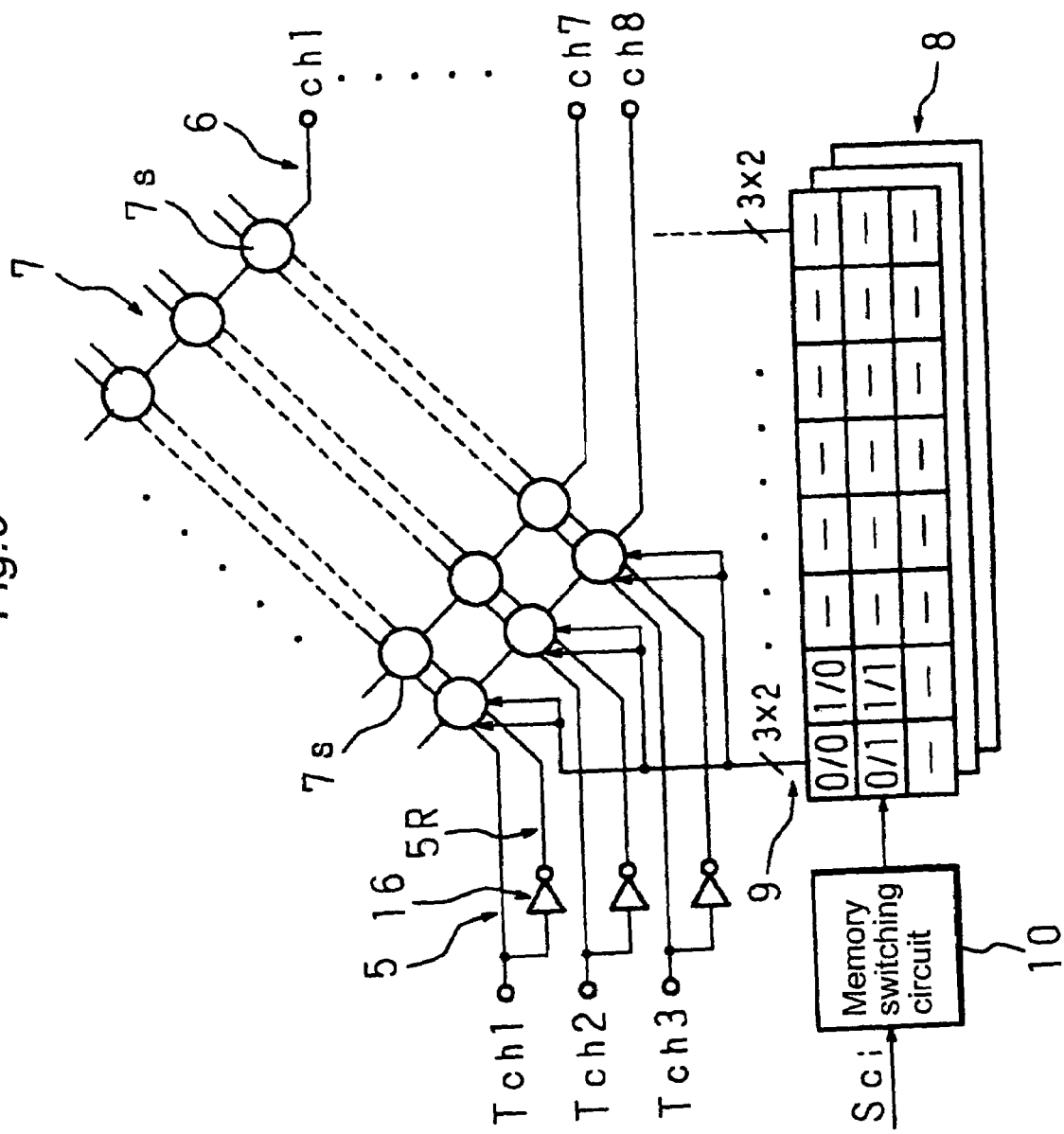

LOGIC CIRCUIT TEST APPARATUS AND LOGIC CIRCUIT TEST METHOD

CROSS-REFERENCE TO RELATED APPLICATION

This application is related to Japanese application No. JP2002-284340 filed on Sep. 27, 2002 whose priority is claimed under 35 USC §119, the disclosure of which is incorporated by reference in its entirety.

BACKGROUND OF THE INVENTION

1. Field of the Invention

The present invention relates to a logic circuit test apparatus and a logic circuit test method for testing a logic circuit by generating original test signals from common test signal output terminals which are smaller in number than input terminals of the logic circuit and/or by generating expected signals from expected signal output terminals which are smaller in number than output terminals of the logic circuit.

2. Description of the Related Art

When a logic circuit (hereinafter referred to as "CUT" or "circuit under test") is tested, input signals (hereinafter referred to as "input test pattern") constituted by a predetermined set of logic signals for causing the logic circuit to operate in an intended manner are inputted to input terminals of the CUT from a logic circuit test apparatus (hereinafter referred to as "tester"). The CUT performs a predetermined operation according to the inputted test pattern, and outputs output signals from output terminals thereof as a result of the operation. Whether or not the CUT operates normally is determined by comparing the output signals of the CUT with expected signals (hereinafter referred to as "output test pattern") which are to be outputted when the CUT is normal.

In the tester for testing the CUT, the number of terminals for outputting the input test pattern to the input terminals of the CUT and the number of terminals for receiving the output signals of the CUT for the comparison of the output signals of the CUT with the output test pattern should be greater than the number of the input terminals and the number of the output terminals of the CUT. That is, the test of the CUT cannot be performed if the number of the terminals of the tester is smaller than the number of the corresponding terminals of the CUT. To this end, the following method is proposed, which makes it possible to test the CUT even with the use of a tester having a reduced number of terminals.

An exemplary method for reduction of the number of the terminals of the tester for the input test pattern is to employ a random pattern generator including linear feedback shift resistors (LFSRs) for reducing the number of inputs from the tester. In this case, the input test pattern to be generated is a periodic pseudo-random pattern, failing to provide an input state suitable to detect a malfunction (or a defect). Therefore, the input test pattern often suffers from a lower malfunction detection ratio. Further, it is impossible to apply exactly the same input test pattern as an original input test pattern prepared for the test of the CUT, failing to ensure a test quality comparable to the original test pattern. That is, the malfunction detection ratio is generally reduced.

An exemplary method for reduction of the number of the terminals of the tester for the output test pattern is to add a compression circuit including a multiple input signature resister (MISR) for the reduction of the terminals. In this method, there is a fear that malfunction information contained in the output signals is missed due to compression. An MISR having m output terminals typically has a missing ratio of about $1/(2^m)$.

An exemplary method for testing the CUT with the use of a reduced number of terminals is to provide latch circuits and shift resistors on opposite ends of the input and output terminals of the CUT for holding the logic states of the input signals and the output signals. In this case, the reduction of the numbers of the input terminals and the output terminals is achieved by serial/parallel conversion. Where the shift resistors each have m stages, for example, the tester should apply the input test pattern at a speed m times the operation speed of the CUT.

FIG. 19 is a block diagram for explaining an example of the conventional method for reducing the number of the input terminals. This method is intended to reduce the number of the terminals by grouping input terminals having the same logic state (see, for example, K. Chakrabarty, B. T. Murray, J. Liu and M. Zhu, "Test Width Compression for Built-in Self Testing", Proceedings International Test Conference, IEEE Computer Society, p.328–337, 1997). In this method, an output (input test pattern) from a test pattern generator 50 constituted by two-bit counters is efficiently inputted to input terminals X1 to X5 of a CUT 52 through a connection expansion circuit 51. The input test pattern is intentionally expanded by adding logic state X (referred to as "don't care" state assuming either logic 1 or logic 0) to the input test pattern for higher sharability. The illustrated input terminals X1 to X5 herein assume the "don't care" state. In this method, however, it is impossible to cause the CUT 52 to operate in conformity with the original input test pattern, requiring processing of the test pattern. Since the test pattern generator 50 and the connection expansion circuit 51 are incorporated in an integrated circuit for the test, this method does not directly relate to the tester. That is, this method is not intended to use a test pattern prepared for the CUT 52, but efficiently use the pattern generator 50 utilizing the LFSRs and the counters. Therefore, terminal assignment for the reduction of the number of the terminals should be determined in consideration of the internal state of the CUT 50, making it difficult to realize a practical circuit.

FIG. 20 is a block diagram for explaining an example of the conventional method for reducing the number of the input and output terminals. This method is disclosed, for example, in Japanese Unexamined Patent Publication No. 10-132902 (1998). In this method, boundary cells 60 to 62 (bidirectional drive/receive IO cells 1 to L (BIDI1 to BIDIL) based on the JTAG joint test action group) standard specified by IEEE1149.1 are used. In a JTAG architecture, common IO lines 63 to 65 of the boundary cells 60 to 62 for serial connection are connected to a single IO line 66 for sub-grouping at a position indicated by a dotted reference line 67 for the reduction of the number of terminals connected to the outside. The boundary cells 60 to 62 are each connected to a data input line 68 to 70, a reception data line 71 to 73 and an HZ control line 74 to 76. In this method, it is merely possible to select one of the boundary cells 60 to 62. Even if two or more of the boundary cells 60 to 62 are simultaneously selected, a signal inputted from the common IO line 66 is transmitted through the common IO lines 63 to 65 to the reception data lines 71 to 73. Therefore, it is impossible to perform a test requiring different logic input signals. Where signals are transmitted from the inside to the outside, the boundary cells 60 to 62 cannot simultaneously be activated, so that the reduction of the number of the terminals is virtually failed. Where the boundary cells 60 to 62 are connected by the JTAG architecture, the signals can be set at any logic state by the serial input. However, the internal operation cannot be performed at a speed close to the actual speed, because time is required for the transfer of the internal data. In addition, the length of the test pattern is enormously increased, because the test pattern is serially inputted.

Further, the arts are disclosed in Japanese Unexamined Patent Publication No. 11-317671 (1999) and International Publication No. 98/43359 relate to methods for compressing test patterns, but not to the reduction of the number of the terminals of the tester.

However, the conventional testers and test methods have drawbacks such that: where the reduction of the number of the terminals is achieved by the compression of the outputs, the shipping quality is deteriorated with some errors; where the reduction of the number of necessary terminals is achieved by operating the tester at a high speed, the operation speed of the tester should be increased several times; and where the reduction of the number of the terminals is achieved by the application of the test pattern by means of the LFSRs and the like, the common line fixed for the reduction of the number of the terminals by sharing the terminals provides a reduced freedom, and the original test pattern cannot be reproduced with high fidelity by employing the test pattern uniquely provided by the LFSRs.

SUMMARY OF THE INVENTION

The present invention provides a logic circuit test apparatus for testing a logic circuit having a plurality of input terminals and a plurality of output terminals by inputting original test signals to the input terminals of the logic circuit and testing output signals from the output terminals of the logic circuit, the logic circuit test apparatus comprising: a common test signal generating circuit which groups the input terminals of the logic circuit on the basis of logic states of original test signals to be applied to the respective input terminals of the logic circuit and outputs common test signals from common test signal output terminals thereof smaller in number than the input terminals of the logic circuit; and an input connection switching circuit which switches connections of the common test signal output terminals of the a common test signal generating circuit with the input terminals of the logic circuit so as to convert the common test signals into the original test signals and apply the original test signals to the respective input terminals of the logic circuit.

In another aspect, the present invention provides a logic circuit test apparatus for testing a logic circuit having a plurality of input terminals and a plurality of output terminals by inputting original test signals to the input terminals of the logic circuit and testing output signals from the output terminals of the logic circuit, the logic circuit test apparatus comprising: a common expected signal generating circuit which groups the output terminals of the logic circuit on the basis of logic states of expected signals to be outputted from the respective output terminals of the logic circuit in association with the original test signals and outputs common expected signals from expected signal output terminals thereof smaller in number than the output terminals of the logic circuit; and an output connection switching circuit which switches connections of the output terminals of the logic circuit with output signal measurement terminals provided in a one-to-one correspondence with the expected signal output terminals of the common expected signal generating circuit so as to compare the output signals outputted from the respective output terminals of the logic circuit with the common expected signals.

DETAILED DESCRIPTION OF THE INVENTION

In view of the foregoing, it is an object of the present invention to provide a logic circuit test apparatus for testing a logic circuit, the apparatus comprising: a common test signal generating circuit which groups input terminals of the logic circuit on the basis of logic states (e.g., logic 0 or logic 1) of an original test pattern (original test signals) to be applied to the respective input terminals of the logic circuit so as to generate and output common test signals for the test from common test signal output terminals smaller in number than the input terminals of the logic circuit; and an input connection switching circuit which switches connections of the common test signal output terminals of the common test signal generating circuit with the input terminals of the logic circuit on the basis of the grouping so as to convert the common test signals into the original test signals and apply the original test signals to the respective input terminals of the logic circuit, whereby the logic circuit test apparatus is operative at the same operation speed as the logic circuit without missing any malfunction due to compression and capable of reproducing the original test pattern prepared for the test of the logic circuit with high fidelity even if the common test signal output terminals thereof (for the common test signals) are smaller in number than the input terminals of the logic circuit.

It is another object of the present invention to provide a logic circuit test apparatus for testing a logic circuit, the apparatus comprising: a common expected signal generating circuit which groups output terminals of the logic circuit on the basis of logic states (e.g., logic 0 or logic 1) of expected signals to be outputted from the respective output terminals of the logic circuit in association with input signals (original test signals) so as to generate and output common expected signals for output judgment from expected signal output terminals smaller in number than the output terminals of the logic circuit; and an output connection switching circuit which switches connections of the output terminals of the logic circuit with output signal measurement terminals (comparison output terminals) provided in a one-to-one correspondence with the expected signal output terminals of the common expected signal generating circuit on the basis of the grouping so as to compare output signals outputted from the respective output terminals of the logic circuit with the common expected signals, whereby the logic circuit test apparatus is operative at the same operation speed as the logic circuit without missing any malfunction due to compression and capable of reproducing an original test pattern prepared for the test of the logic circuit with high fidelity even if the expected signal output terminals thereof (for the common expected signals) are smaller in number than the output terminals of the logic circuit.

It is further another object of the present invention to provide a logic circuit test apparatus for testing a logic circuit, the apparatus comprising: a common test signal generating circuit and an input connection switching circuit for input terminals of the logic circuit; and a common expected signal generating circuit and an output connection switching circuit for output terminals of the logic circuit, whereby the apparatus is operative at the same operation speed as the logic circuit without missing any malfunction due to compression and capable of reproducing an original test pattern prepared for the test of the logic circuit with high fidelity even if common test signal output terminals thereof for common test signals are smaller in number than the input terminals of the logic circuit and expected signal output terminals thereof for common expected signals are smaller in number than the output terminals of the logic circuit.

It is still another object of the present invention to provide a logic circuit test method for testing a logic circuit, the method comprising the steps of: grouping input terminals of the logic circuit on the basis of logic states of original test signals, further grouping the grouped input terminals on the basis of logic states of the original test signals in the next cycle period, and sequentially repeating the grouping of the input terminals until the number of input terminal groups exceeds the number of common test signal output terminals of a common test signal generating circuit; and, when the number of the groups exceeds the number of the common test signal output terminals of the common test signal generating circuit, generating common test signals for corresponding respective input terminal groups provided immediately before the last grouping to the common test signal output terminals of the common test signal generating circuit, whereby a logic circuit test apparatus is capable of reproducing an original test pattern (input test pattern) prepared for the test of the logic circuit with high fidelity even if the common test signal output terminals thereof (for the common test signals) are smaller in number than the input terminals of the logic circuit.

It is further another object of the present invention to provide a logic circuit test method for testing a logic circuit, the method comprising the steps of: grouping output terminals of the logic circuit on the basis of logic states of expected signals, further grouping the grouped output terminals on the basis of logic states of the expected signals in the next cycle period, and sequentially repeating the grouping of the output terminals until the number of output terminal groups exceeds the number of expected signal output terminals of a common expected signal generating circuit; and, when the number of the groups exceeds the number of the expected signal output terminals of the common expected signal generating circuit, generating common expected signals for corresponding respective output terminal groups provided immediately before the last grouping to the expected signal output terminals of the common expected signal generating circuit, whereby a logic circuit test apparatus is capable of reproducing an original test pattern (output test pattern) prepared for the test of the logic circuit with high fidelity even if the expected signal output terminals thereof (for the common expected signals) are smaller in number than the output terminals of the logic circuit.

It is still another object of the present invention to provide a logic circuit test method for testing a logic circuit, the method comprising the steps of: grouping input terminals of the logic circuit on the basis of logic states of original test signals, and generating common test signals for corresponding respective input terminal groups to common test signal output terminals of a common test signal generating circuit; grouping output terminals of the logic circuit on the basis of logic states of expected signals, and generating common expected signals for corresponding respective output terminal groups to expected signal output terminals of a common expected signal generating circuit, whereby a logic circuit test apparatus is capable of reproducing an original test pattern prepared for the test of the logic circuit with high fidelity even if the common test signal output terminals thereof for the common test signals are smaller in number than the input terminals of the logic circuit and the expected signal output terminals thereof for the common expected signals are smaller in number than the output terminals of the logic circuit.

According to a first aspect of the present invention, there is provided a logic circuit test apparatus for testing a logic circuit having a plurality of input terminals and a plurality of output terminals by inputting original test signals to the input terminals of the logic circuit and testing output signals from the output terminals of the logic circuit, the logic circuit test apparatus comprising: a common test signal generating circuit which groups the input terminals of the logic circuit on the basis of logic states of original test signals to be applied to the respective input terminals of the logic circuit and outputs common test signals from common test signal output terminals thereof smaller in number than the input terminals of the logic circuit; and an input connection switching circuit which switches connections of the common test signal output terminals of the common test signal generating circuit with the input terminals of the logic circuit so as to convert the common test signals into the original test signals and apply the original test signals to the respective input terminals of the logic circuit.

In the logic circuit test apparatus according to the first inventive aspect, the common test signal generating circuit may group the input terminals on the basis of the logic states of the original test signals and logic states of inverted signals obtained by logic inversion of the original test signals to generate the common test signals.

In the logic circuit test apparatus according to the first inventive aspect, the input connection switching circuit may comprise an input connection switching information memory for switching the connections, the memory storing therein input connection switching information necessary for switching the connections of the common test signal output terminals of the common test signal generating circuit with the input terminals of the logic circuit.

According to a second aspect of the present invention, there is provided a logic circuit test apparatus for testing a logic circuit having a plurality of input terminals and a plurality of output terminals by inputting original test signals to the input terminals of the logic circuit and testing output signals from the output terminals of the logic circuit, the logic circuit test apparatus comprising: a common expected signal generating circuit which groups the output terminals of the logic circuit on the basis of logic states of expected signals to be outputted from the respective output terminals of the logic circuit in association with the original test signals and outputs common expected signals from expected signal output terminals thereof smaller in number than the output terminals of the logic circuit; and an output connection switching circuit which switches connections of the output terminals of the logic circuit with output signal measurement terminals provided in a one-to-one correspondence with the expected signal output terminals of the common expected signal generating circuit so as to compare the output signals outputted from the respective output terminals of the logic circuit with the common expected signals.

In the logic circuit test apparatus according to the second inventive aspect, the common expected signal generating circuit may group the output terminals of the logic circuit on the basis of the logic states of the expected signals and logic states of inverted expected signals obtained by logic inversion of the expected signals to generate the common expected signals.

In the logic circuit test apparatus according to the second inventive aspect, the output connection switching circuit may comprise an output connection switching information memory for switching the connections, the memory storing therein output connection switching information necessary for switching the connections of the output signal measurement terminals with the output terminals of the logic circuit.

According to a third aspect of the present invention, there is provided a logic circuit test apparatus for testing a logic circuit having a plurality of input terminals and a plurality of output terminals by inputting original test signals to the input terminals of the logic circuit and testing output signals from the output terminals of the logic circuit, the logic circuit test apparatus comprising: a common test signal generating circuit which groups the input terminals of the logic circuit on the basis of logic states of original test signals to be applied to the respective input terminals of the logic circuit and outputs common test signals from common test signal output terminals thereof smaller in number than the input terminals of the logic circuit; an input connection switching circuit which switches connections of the common test signal output terminals of the common test signal generating circuit with the input terminals of the logic circuit so as to convert the common test signals into the original test signals and apply the original test signals to the input terminals of the logic circuit; a common expected signal generating circuit which groups the output terminals of the logic circuit on the basis of logic states of expected signals to be outputted from the respective output terminals of the logic circuit in association with the original test signals and outputs common expected signals from expected signal output terminals thereof smaller in number than the output terminals of the logic circuit; an output connection switching circuit which switches connections of the output terminals of the logic circuit with output signal measurement terminals provided in a one-to-one correspondence with the expected signal output terminals of the common expected signal generating circuit so as to compare the output signals outputted from the respective output terminals of the logic circuit with the common expected signals; and a connection switching control circuit for synchronously controlling the input connection switching circuit and the output connection switching circuit.

According to a fourth aspect of the present invention, there is provided a logic circuit test method for testing a logic circuit having a plurality of input terminals and a plurality of output terminals by inputting original test signals to the input terminals of the logic circuit and testing output signals from the output terminals of the logic circuit, the logic circuit test method comprising the steps of: grouping the input terminals of the logic circuit on the basis of logic states of original test signals to be applied to the respective input terminals of the logic circuit, further grouping the grouped input terminals on the basis of logic states of the original test signals in the next cycle period, and sequentially repeating the grouping of the input terminals until the number of input terminal groups exceeds the number of common test signal output terminals of a common test signal generating circuit smaller than the number of the input terminals of the logic circuit so as to output common test signals from the common test signal output terminals of the common test signal generating circuit; and, when the number of the groups exceeds the number of the common test signal output terminals of the common test signal generating circuit, generating the common test signals for corresponding respective input terminal groups provided immediately before the last grouping to the common test signal output terminals of the common test signal generating circuit.

In the logic circuit test method according to the fourth inventive aspect, the common test signal generating circuit may group the input terminals on the basis of the logic states of the original test signals and logic states of inverted signals obtained by logic inversion of the original test signals, repeats the grouping until the number of input terminal groups exceeds a number twice the number of the common test signal output terminals of the common test signal generating circuit and, when the number of the groups exceeds the number twice the number of the common test signal output terminals of the common test signal generating circuit, generates the common test signals for corresponding respective input terminal groups obtained by removing equivalent groups from input terminal groups provided immediately before the last grouping to the common test signal output terminals of the common test signal generating circuit.

According to a fifth aspect of the present invention, there is provided a logic circuit test method for testing a logic circuit having a plurality of input terminals and a plurality of output terminals by inputting original test signals to the input terminals of the logic circuit and testing output signals from the output terminals of the logic circuit, the logic circuit test method comprising the steps of: grouping the output terminals of the logic circuit on the basis of logic states of expected signals to be outputted from the respective output terminals of the logic circuit in association with the original test signals, further grouping the grouped output terminals on the basis of logic states of the expected signals in the next cycle period, and sequentially repeating the grouping of the output terminals until the number of output terminal groups exceeds the number of expected signal output terminals of a common expected signal generating circuit smaller than the number of the output terminals of the logic circuit so as to output common expected signals from the expected signal output terminals of the common expected signal generating circuit; and, when the number of the groups exceeds the number of the expected signal output terminals of the common expected signal generating circuit, generating the common expected signals for corresponding respective output terminal groups provided immediately before the last grouping to the expected signal output terminals of the common expected signal generating circuit.

In the logic circuit test method according to the fifth inventive aspect, the common expected signal generating circuit may group the output terminals of the logic circuit on the basis of the logic states of the expected signals and logic states of inverted signals obtained by logic inversion of the expected signals, sequentially repeats the grouping until the number of output terminal groups exceeds a number twice the number of the expected signal output terminals of the common expected signal generating circuit and, when the number of the groups exceeds the number twice the number of the expected signal output terminals of the common expected signal generating circuit, generates the common expected signals for corresponding output terminal groups obtained by removing equivalent groups from output terminal groups provided immediately before the last grouping to the expected signal output terminals of the common expected signal generating circuit.

According to a sixth aspect of the present invention, there is provided a logic circuit test method for testing a logic circuit having a plurality of input terminals and a plurality of output terminals by inputting original test signals to the input terminals of the logic circuit and testing output signals from the output terminals of the logic circuit, the logic circuit test method comprising the steps of: grouping the input terminals of the logic circuit on the basis of logic states of original test signals to be applied to the input terminals of the logic circuit, further grouping the grouped input terminals on the basis of logic states of the original test signals in the next cycle period, and sequentially repeating the grouping of the input terminals until the number of input terminal groups exceeds the number of common test signal output terminals of a common test signal generating circuit smaller than the number of the input terminals of the logic circuit so as to output common test signals from the common test signal output terminals of the common test signal generating circuit; when the number of the groups exceeds the number of the common test signal output terminals of the common test signal generating circuit, generating the common test signals for corresponding respective input terminal groups provided immediately before the last grouping to the common test signal output terminals of the common test signal generating circuit; grouping the output terminals of the logic circuit on the basis of logic states of expected signals to be outputted from the respective output terminals of the logic circuit in association with the original test signals, further grouping the grouped output terminals on the basis of logic states of the expected signals in the next cycle period, and sequentially repeating the grouping of the output terminals until the number of output terminal groups exceeds the number of expected signal output terminals of a common expected signal generating circuit smaller than the number of the output terminals of the logic circuit so as to output common expected signals from the expected signal output terminals of the common expected signal generating circuit; and, when the number of the groups exceeds the number of the expected signal output terminals of the common expected signal generating circuit, generating the common expected signals for corresponding respective output terminal groups provided immediately before the last grouping to the expected signal output terminals of the common expected signal generating circuit.

The first inventive logic circuit test apparatus for testing the logic circuit, which comprises the common test signal generating circuit which groups the input terminals of the logic circuit on the basis of the logic states of the original test pattern (original test signals) to be applied to the respective input terminals of the logic circuit so as to generate and output the common test signals for the test from the common test signal output terminals smaller in number than the input terminals of the logic circuit, and the input connection switching circuit which switches the connections of the common test signal output terminals of the common test signal generating circuit with the input terminals of the logic circuit on the basis of the grouping so as to convert the common test signals into the original test signals and apply the original test signals to the respective input terminals of the logic circuit, is operative at the same operation speed as the logic circuit without missing any malfunction due to compression and capable of reproducing the original test pattern prepared for the test of the logic circuit with high fidelity even if the common test signal output terminals thereof (for the common test signals) are smaller in number than the input terminals of the logic circuit.

The second inventive logic circuit test apparatus for testing the logic circuit, which comprises the common expected signal generating circuit which groups the output terminals of the logic circuit on the basis of the logic states of the expected signals to be outputted from the respective output terminals of the logic circuit in association with the input signals (original test signals) so as to generate and output the common expected signals for output judgment from the expected signal output terminals smaller in number than the output terminals of the logic circuit, and the output connection switching circuit which switches the connections of the output terminals of the logic circuit with the output signal measurement terminals (comparison output terminals) provided in a one-to-one correspondence with the expected signal output terminals of the common expected signal generating circuit on the basis of the grouping so as to compare the output signals outputted from the respective output terminals of the logic circuit with the common expected signals, is operative at the same operation speed as the logic circuit without missing any malfunction due to compression and capable of reproducing the original test pattern prepared for the test of the logic circuit with high fidelity even if the expected signal output terminals thereof (for the common expected signals) are smaller in number than the output terminals of the logic circuit.

The third inventive logic circuit test apparatus for testing the logic circuit, which comprises the common test signal generating circuit and the input connection switching circuit for the input terminals of the logic circuit, and the common expected signal generating circuit and the output connection switching circuit for the output terminals of the logic circuit, is operative at the same operation speed as the logic circuit without missing any malfunction due to compression and capable of reproducing the original test pattern prepared for the test of the logic circuit with high fidelity even if the common test signal output terminals for the common test signals are smaller in number than the input terminals of the logic circuit and the expected signal output terminals for the common expected signals are smaller in number than the output terminals of the logic circuit.

In the first inventive logic circuit test method for testing the logic circuit, the input terminals of the logic circuit are grouped on the basis of the logic states of the original test signals, then the grouped input terminals are further grouped on the basis of the logic states of the original test signals in the next cycle period, and the grouping of the input terminals is sequentially repeated until the number of the input terminal groups exceeds the number of the common test signal output terminals of the common test signal generating circuit. When the number of the groups exceeds the number of the common test signal output terminals of the common test signal generating circuit, the common test signals are generated for corresponding the respective input terminal groups provided immediately before the last grouping to the common test signal output terminals of the common test signal generating circuit. Thus, the logic circuit test apparatus is capable of reproducing the original test pattern prepared for the test of the logic circuit with high fidelity even if the common test signal output terminals thereof (for the common test signals) are smaller in number than the input terminals of the logic circuit.

In the second inventive logic circuit test method for testing the logic circuit, the output terminals of the logic circuit are grouped on the basis of the logic states of the expected signals, then the grouped output terminals are further grouped on the basis of the logic states of the expected signals in the next cycle period, and the grouping of the output terminals is sequentially repeated until the number of the output terminal groups exceeds the number of the expected signal output terminals of the common expected signal generating circuit. When the number of the groups exceeds the number of the expected signal output terminals of the common expected signal generating circuit, the common expected signals are generated for corresponding the respective output terminal groups provided immediately before the last grouping to the expected signal output terminals of the common expected signal generating circuit. Thus, the logic circuit test apparatus is capable of reproducing the original test pattern prepared for the test of the logic circuit with high fidelity even if the expected signal output terminals thereof (for the common expected signals) are smaller in number than the output terminals of the logic circuit.

In the third inventive logic circuit test method for testing the logic circuit, the input terminals of the logic circuit are grouped on the basis of the logic states of the original test signals, and the common test signals are generated for corresponding the respective input terminal groups to the common test signal output terminals of the common test signal generating circuit. Further, the output terminals of the logic circuit are grouped on the basis of the logic states of the expected signals, and the common expected signals are generated for corresponding the respective output terminal groups to the expected signal output terminals of the common expected signal generating circuit. Thus, the logic circuit test apparatus is capable of reproducing the original test pattern prepared for the test of the logic circuit with high fidelity even if the common test signal output terminals thereof for the common test signals are smaller in number than the input terminals of the logic circuit and the expected signal output terminals thereof for the common expected signals are smaller in number than the output terminals of the logic circuit.

BRIEF DESCRIPTION OF THE DRAWINGS

FIG. 4 is a diagram for explaining a method for grouping input terminals as shown in FIG. 2;

FIG. 8 is a diagram for explaining a method for grouping input terminals as shown in FIG. 7;

FIG. 9 is a block diagram illustrating, in detail, an input connection switching circuit for realizing the relationship shown in FIG. 7;

With reference to the attached drawings, the present invention will hereinafter be described in detail by way of embodiments thereof.

FIRST EMBODIMENT

Figure 1:
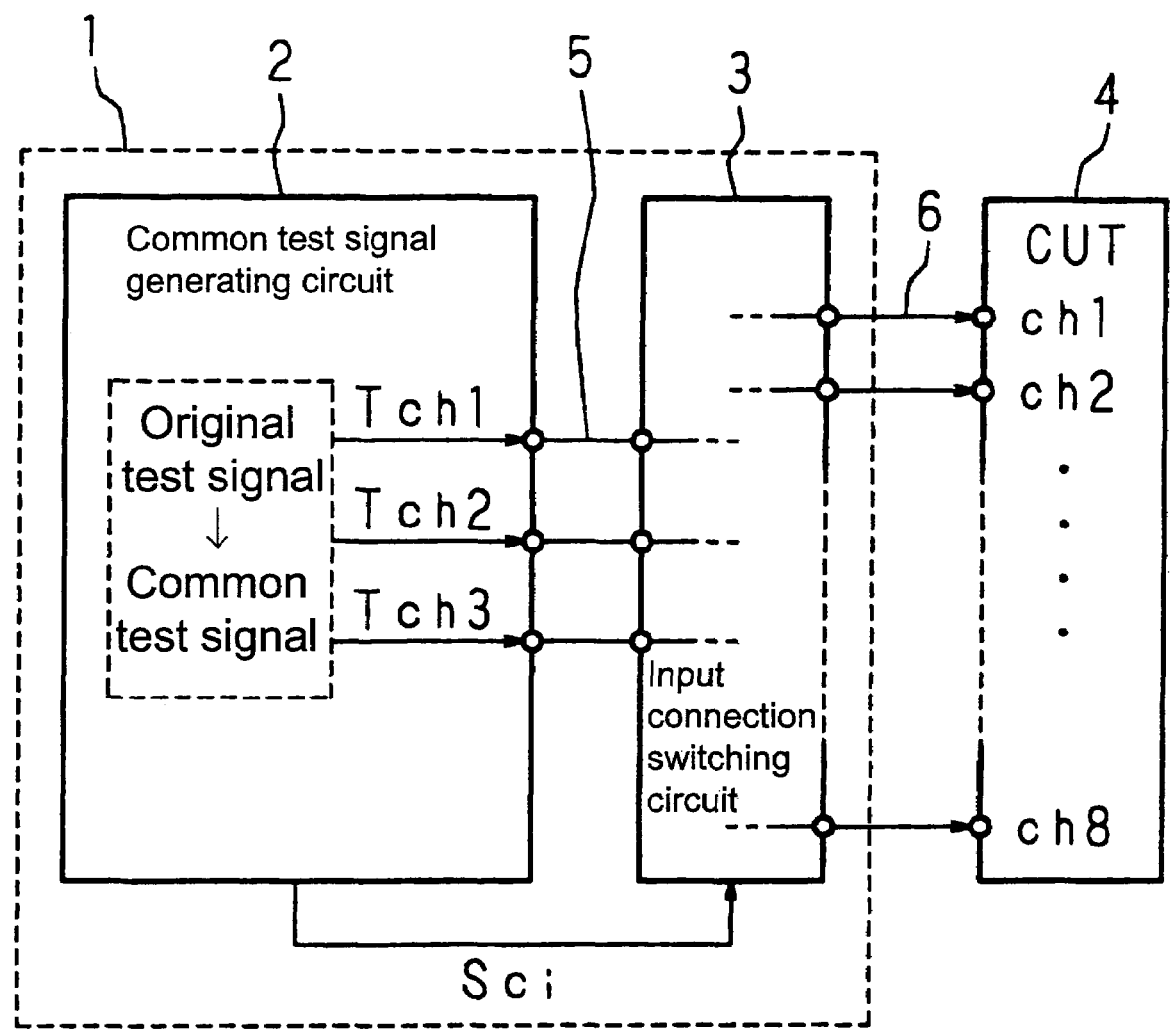
FIG. 1 is a block diagram schematically illustrating a test apparatus according to a first embodiment of the present invention.

FIG. 1 is a block diagram schematically illustrating a test apparatus according to a first embodiment. A logic circuit test apparatus 1 (hereinafter referred to as "tester 1") is adapted to test a logic circuit 4 (hereinafter referred to as "CUT 4") having a plurality of input terminals (eight input terminals ch1 to ch8 in this embodiment) and a plurality of output terminals (not shown) by inputting original test signals to the input terminals ch1 to ch8 of the CUT 4 and testing output signals from the output terminals of the CUT 4. The tester 1 includes a common test signal generating circuit 2 and an input connection switching circuit 3. The common test signal generating circuit 2 is adapted to group the input terminals ch1 to ch8 of the CUT 4 on the basis of logic states of original test signals (input test pattern) to be applied to the input terminals ch1 to ch8, generate common test signals in association with common test signal output terminals (three common test signal output terminals Tch1 to Tch3 in this embodiment) smaller in number than the input terminals ch1 to ch8 by sharing the common test signal output terminals Tch1 to Tch3, and output the common test signals from the common test signal output terminals Tch1 to Tch3. The common test signals are outputted to the input connection switching circuit 3 from the common test signal generating circuit 2 through common test signal output lines 5.

The input connection switching circuit 3 is adapted to switch connections of the common test signal output terminals Tch1 to Tch3 of the common test signal generating circuit 2 with the input terminals ch1 to ch8 of the CUT 4 in accordance with the grouping on the basis of an input connection switching control signal Sci supplied thereto from the common test signal generating circuit 2. That is, the input connection switching circuit 3 converts the common test signals provided on the basis of the original test signals into the original test signals, which are in turn inputted to the respective input terminals ch1 to ch8 of the CUT 4 through original test signal input lines 6. With the provision of the input connection switching circuit 3, the tester 1 can reproduce the original test signals with high fidelity for the test even if the common test signal output terminals Tch1 to Tch3 (for the common test signals) are smaller in number than the input terminals ch1 to ch8 of the CUT 4. In the tester 1, the provision of the common test signal generating circuit 2 makes it possible to reduce the number of the common test signal output terminals Tch1 to Tch3 as compared with the number of the original test signals to be equivalently inputted to the respective input terminals ch1 to ch8 of the CUT 4.

In the tester 1, a comparison circuit (not shown) compares the levels of output signals from the output terminals of the CUT 4 with the levels of expected signals prepared for the original test signals to determine whether the output signals match the expected signals, thereby determining the acceptability of the CUT 4 on the basis of the result. The output signals from the output terminals of the CUT 4 may be tested by terminal sharing (according to a third embodiment to be described later) to be carried out in the same manner as on the input side, or without the terminal sharing.

Figure 2:
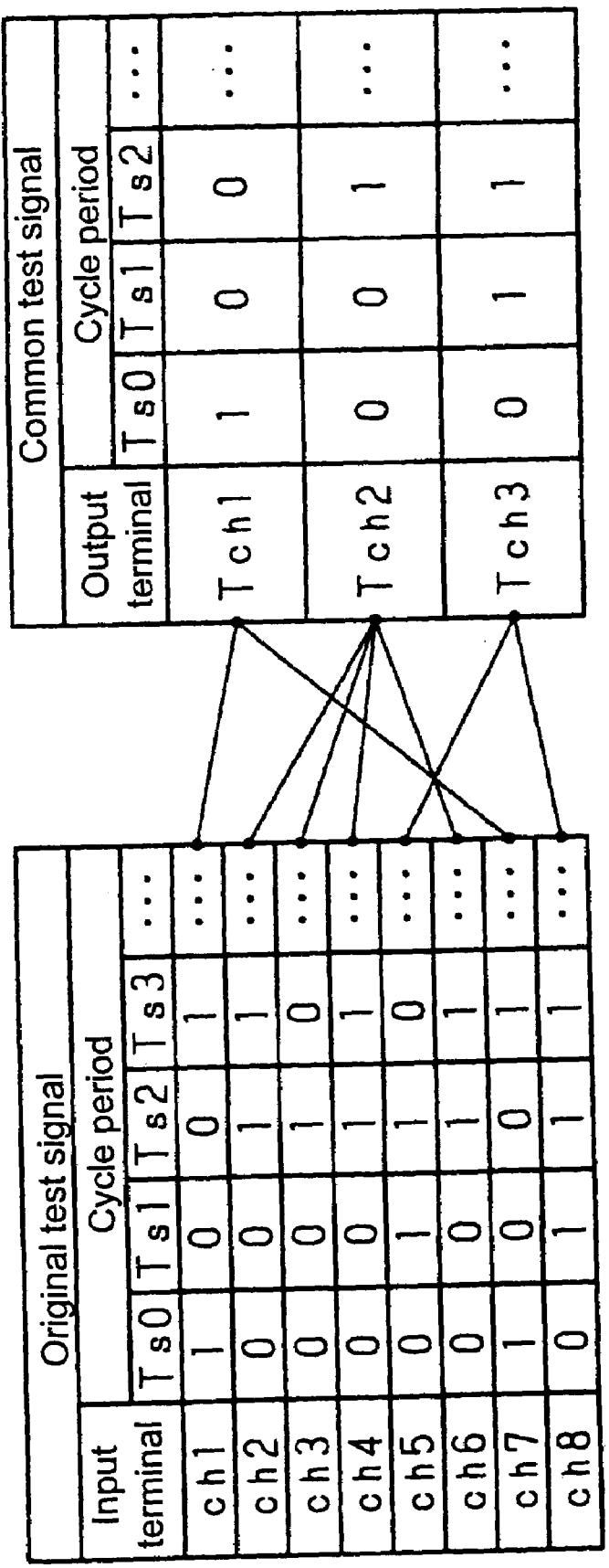
FIG. 2 is a diagram for explaining a relationship between original test signals and common test signals in the apparatus shown in FIG. 1.

FIG. 2 is a diagram for explaining a relationship between the original test signals and the common test signals in the tester shown in FIG. 1. The original test signals to be inputted to the input terminals ch1 to ch8 of the CUT 4 in cycle periods Ts0 to Ts3 are shown in FIG. 2 by way of an example. For example, original test signals to be sequentially inputted to the input terminal ch1 in the cycle periods Ts0, Ts1, Ts2 and Ts3 have logic states of 1, 0, 0 and 1, respectively. Original test signals to be sequentially inputted to the input terminal ch7 in the cycle periods Ts0, Ts1, Ts2 and Ts3 have logic states of 1, 0, 0 and 1, respectively. That is, the same original test signals are inputted to the input terminals ch1 and ch7. Therefore, the input terminals ch1 and ch7 are classified into the same group to share the common test signal output terminal Tch1 when the original test signals to be inputted to the input terminals ch1 and ch7 are outputted from the common test signal generating circuit 2. The other terminals are grouped in the same manner. In the cycle periods Ts0 to Ts2, the input terminals ch1 and ch7 of the CUT 4 are classified into the same group to share the common test signal output terminal Tch1 of the common test signal generating circuit 2, and the input terminals ch2, ch3, ch4 and ch6 are classified into the same group to share the common test signal output terminal Tch2 of the common test signal generating circuit 2. Further, the input terminals ch5 and ch8 are classified into the same group to share the common test signal output terminal Tch3 of the common test signal generating circuit 2. Thus, the common test signal output terminals Tch1 to Tch3 are shared by the respective groups of the input terminals ch1 to ch8.

In the cycle period Ts3, the original test signals to be inputted to the input terminals ch2 and ch3 have different logic states. Therefore, when the cycle period Ts3 is taken into account, the input terminals ch2 and ch3 cannot be classified into the same group corresponding to the common test signal output terminal Tch3. In this embodiment, the cycle periods Ts0 to Ts2 constitute a grouping segment, which is also called "segment period". Therefore, the input terminals may further be grouped according to logic states of the original test signals applied in the cycle period Ts3 and subsequent cycle periods. The original test signals applied in the cycle periods Ts0, Ts1, Ts2 and Ts3 constitute a part (segment) of a test pattern. Therefore, the grouping in the entire period is carried out in the aforesaid manner to provide common test signals in association with the respective groups for the test of the CUT 4.

Figure 3:
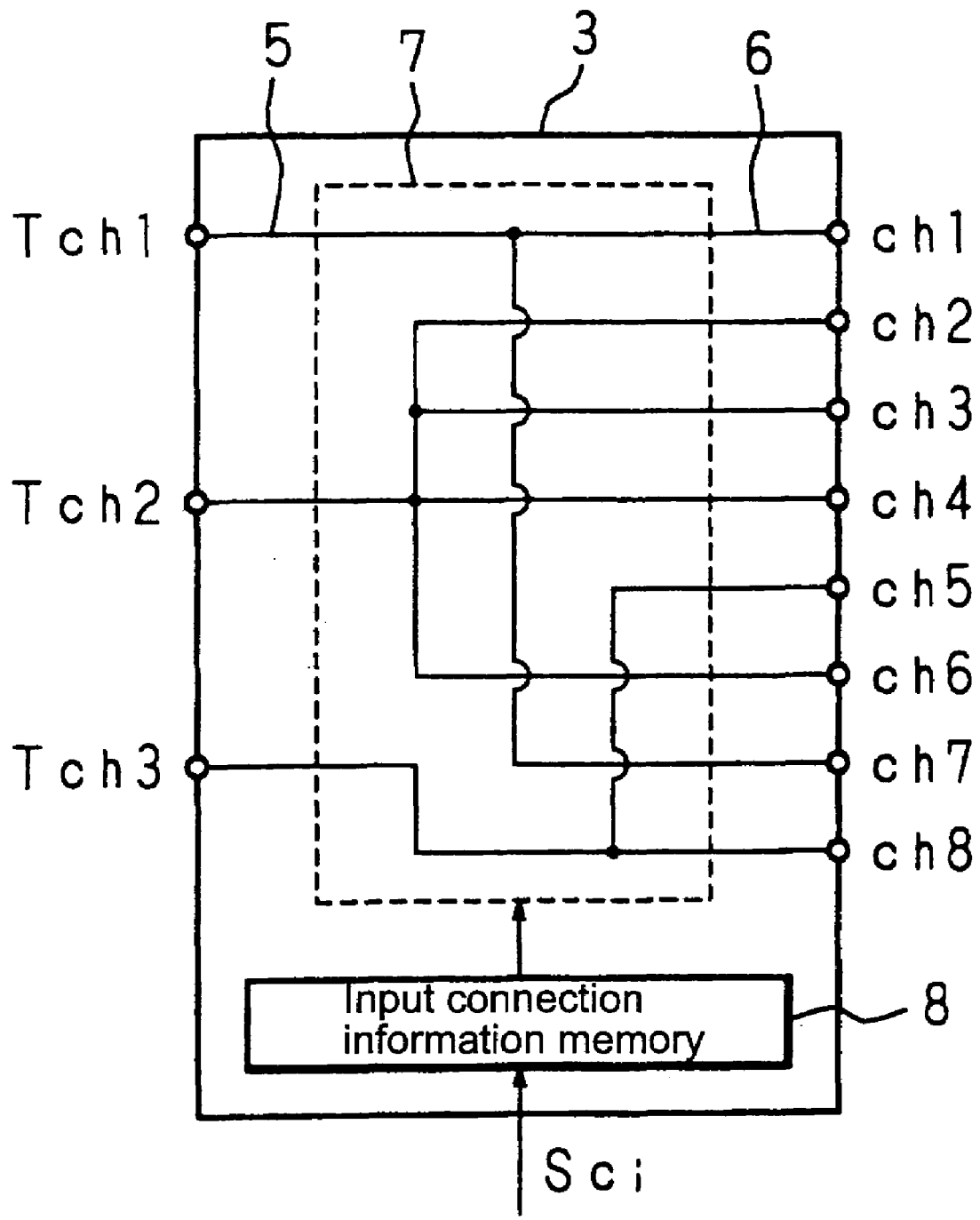
FIG. 3 is a block diagram schematically illustrating an input connection switching circuit shown in FIG. 1.

FIG. 3 is a block diagram schematically illustrating the input connection switching circuit shown in FIG. 1. The input connection switching circuit 3 includes an input connection switching block 7 connected to the common test signal output lines 5 as signal lines extending from the common test signal output terminals Tch1 to Tch3 of the common test signal generating circuit 2 and to the original test signal input lines 6 as signal lines extending to the input terminals ch1 to ch8 of the CUT 4. The input connection switching block 7 is controlled for switching on the basis of the content of an input connection switching information memory 8. The input connection switching information memory 8 is controlled on the basis of the input connection switching control signal Sci. For simplification, the connections in the cycle periods Ts0 to Ts2 in FIG. 2 are herein illustrated as fixed lines. In the input connection switching block 7, the common test signal output terminal Tch1 is connected to the input terminals ch1 and ch7, and the common test signal output terminal Tch2 is connected to the input terminals ch2, ch3, ch4 and ch6. Further, the common test signal output terminal Tch3 is connected to the input terminals ch5 and ch8. The connections between the common test signal output terminals Tch1 to Tch3 and the input terminals ch1 to ch8 are switched on the basis of the grouping (on the basis of the content of the input connection switching information memory 8). Further, the connections in the cycle period Ts3 and the subsequent cycle periods are also switched on the basis of the logic states of the original test signals.

Where various tests are actually performed by means of the CUT 4, it is rare that the common test signal output terminals (Tc1 to Tc3) are shared for the original test signals (input test pattern) from the first cycle period to the last cycle period. Therefore, it is desired to establish the connections by means of hardware such as a PLD capable of re-configuration (switching the connections). The re-configuration of the PLD can easily be achieved by direct control from the common test signal generating circuit 2. Where the time required for the re-configuration of the PLD is a matter of concern, however, the connection information is preliminarily stored in the input connection switching information memory 8 so as to be switched at a high speed on the basis of the input connection switching control signal Sci. Thus, the terminal sharability is improved, thereby ensuring a high speed operation.

FIG. 4 is a diagram for explaining a method for grouping the input terminals as shown in FIG. 2. The input terminals ch1 to ch8 are grouped on the basis of the logic states of the original test signals, and the resulting input terminal groups are associated with the common test signal output terminals Tch1 to Tch3. Thus, the original test signals (input test pattern) to be inputted to the input terminals ch1 to ch8 are converted into the common test signals, which are outputted from the common test signal output terminals Tch1 to Tch3. Next, an explanation will be given to how to group the input terminals ch1 to ch8 on the basis of the logic states of the original test signals in each of the cycle periods. For simplification, some of the reference characters are not shown in FIG. 4. In the cycle period Ts0, there are two logic states, i.e., logic 0 and logic 1. A group assuming logic 1 and a group assuming logic 0 in the cycle period Ts0 are denoted by Gr1 and Gr0, respectively. In the following explanation, groups will be denoted by similar notations employing logic states. On the basis of the logic states shown in FIG. 2, the input terminals ch1 and ch7 are classified into the group Gr1, and the input terminals ch2, ch3, ch4, ch5, ch6 and ch8 are classified into the group Gr0. At this time point, the number n of the groups is two.

Next, the input terminals ch1 and ch7 classified in the group Gr1 and the input terminals ch2, ch3, ch4, ch5, ch6 and ch8 classified in the group Gr0 in the cycle period Ts0 are further grouped on the basis of the logic states in the next cycle period Ts1. That is, the grouping is based on the logic states in the cycle periods Ts0 and Ts1. A group assuming logic 1 in the cycle period Ts0 and assuming logic 0 in the cycle period Ts1 is denoted by Gr10, and a group assuming logic 1 in the cycle period Ts0 and assuming logic 1 in the cycle period Ts1 is denoted by Gr11. Further, a group assuming logic 0 in the cycle period Ts0 and assuming logic 0 in the cycle period Ts1 is denoted by Gr00, and a group assuming logic 0 in the cycle period Ts0 and assuming logic 1 in the cycle period Ts1 is denoted by Gr01. The input terminals ch1 and ch7 are classified into the group Gr10, and no input terminal is classified into the group Gr11, which is herein a null set φ. The input terminals ch2, ch3, ch4 and ch6 are classified into the group Gr00, and the input terminals ch5 and ch8 are classified into the group Gr01. Since the null set φ has no entity (there is no input terminal in the null set φ), the group Gr01 is not counted. Therefore, the number n of the groups is three at this time point.

The grouping is sequentially repeated until the number of the groups resulting from the grouping of the input terminals ch1 to ch8 exceeds the number N of the common test signal output terminals Tch1 to Tch3 of the common test signal generating circuit 2 (also referred to as "common target terminal number N", which is N=3 in FIG. 4 (FIG. 1)). When the number n of the groups exceeds the number N of the common test signal output terminals Tch1 to Tch3 of the common test signal generating circuit 2, the respective input terminal groups provided immediately before the last grouping are associated with the common test signal output terminals of the common test signal generating circuit 2 to generate the common test signals.

Since the input terminals ch1 to ch8 are classified into the three groups (n=3) on the basis of the logic states thereof in the cycle periods Ts0 to Ts2, the input terminals ch1 to ch8 are further grouped on the basis of the logic states thereof in the cycle period Ts3. In the cycle periods Ts0 to Ts3, the input terminals ch1 and ch7 are classified into a group Gr1001, and the input terminal ch3 is classified into a group Gr0010. The input terminals ch2, ch4 and ch6 are classified into a group Gr0011, and the input terminal ch5 is classified into a group Gr0110. Further, the input terminal ch8 is classified into a group Gr0111. No input terminal is classified into a group Gr1000, which is a null set and, hence, is not counted in the group number n. Therefore, the number n of the groups is five at this time point. Since the number n of the groups exceeds the common target terminal number N, the input terminal groups provided immediately before the last grouping (i.e., the three groups provided by the grouping of the input terminals (ch1 to ch8) in the cycle periods Ts0 to Ts2) are associated with the common test signal output terminals Tch1 to Tch3 to generate the common test signals. The groups provided in the cycle periods Ts0 to Ts2 are a group Gr100, a group Gr001 and a group Gr011, and the number n of the groups is three. The input terminals ch1 and ch7 are classified into the group Gr100, and the input terminals ch2, ch3, ch4 and ch6 are classified into the group Gr001. The input terminals ch5 and ch8 are classified into the group Gr011. The groups Gr100, Gr001 and Gr011 are associated with the common test signal output terminals Tch1, Tch2 and Tch3, respectively. Thus, the original test signals to be inputted to the eight input terminals ch1 to ch8 are converted into the common test signals to be outputted from the three common test signal output terminals Tch1 to Tch3, whereby the number of terminals can equivalently be reduced for the generation of the common test signals. No input terminal is classified into the groups Gr101, Gr000 and Gr010, which are null sets and, hence, are not counted in the group number n.

As described above, the basic concept is that input terminals (ch1 to ch8) assuming the same logic state are grouped together for the terminal sharing to reduce the number of terminals required for the test, and the input terminals to be grouped together for the terminal sharing are determined so that the number of the input terminal groups is reduced below a predetermined terminal number (common target terminal number N). A typically method for determining the input terminals to be grouped together for the terminal sharing is to select and group together input terminals assuming the same logic state in each of the cycle periods starting from the cycle period Ts0 (the first line) in the original input test pattern (original test signals) by sequential comparison. However, the sequential comparison requires a great number of comparative computations. Where the terminal sharability for ten input terminals in the first line of the test pattern is determined by the sequential comparison, for example, 45 comparative computations are required, which are equivalent to the number of combinations of two input terminals selected from the ten input terminals. On the other hand, where the terminal sharability for ten input terminals is determined on the basis of the logic state (i.e., logic 0 or logic 1), it is merely necessary to perform the grouping operation ten times. Hence, there is an advantage that a computation load can relatively be reduced as the length of the input test pattern is increased.

Figure 5:
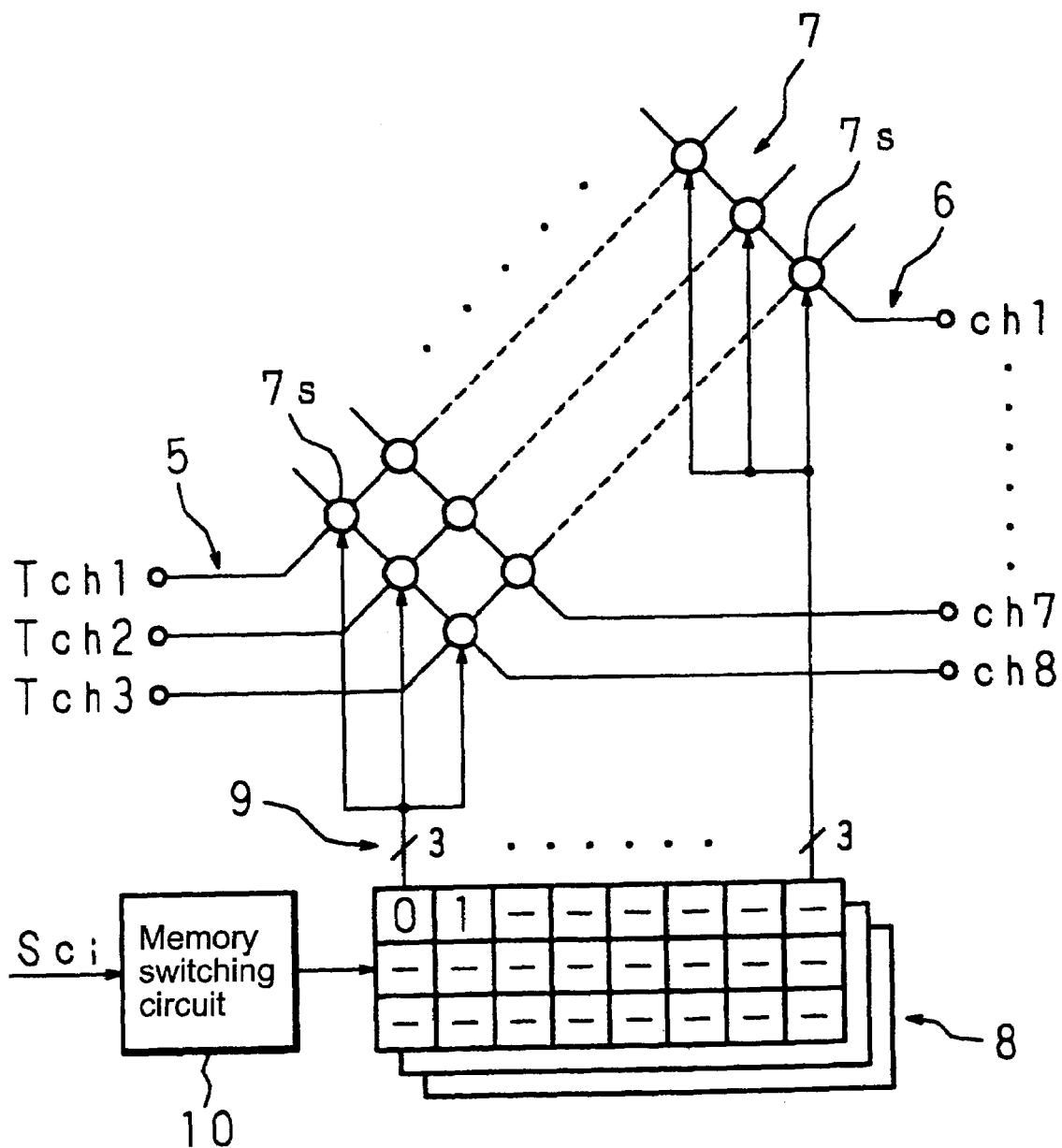
FIG. 5 is a block diagram illustrating the input connection switching circuit of FIG. 3 in detail.

FIG. 5 is a block diagram illustrating the input connection switching circuit of FIG. 3 in detail. The input connection switching block 7 includes 24 switches 7s provided at matrix points (3×8) defined by intersections between the common test signal output lines 5 extending from the common test signal output terminals Tch1 to Tch3 and the original test signal input lines 6 extending to the input terminals ch1 to ch8. The switches 7s are each connected to the corresponding common test signal output line 5 and the corresponding original test signal input line 6 at opposite ends thereof for switching the connection of the common test signal output line 5 with the original test signal input line 6. The switches 7s are each constituted by an analog switch, and switching signals (opening/closing signals) according to the memory content are applied to the respective switches 7s from the input connection switching information memory 8 through switch selection signal lines 9 to properly switch the switches 7s. The input connection switching information memory 8 has a matrix bit configuration (a 3×8-bit configuration), and stores switching information for the respective matrix points at the intersections in the form of logic 1 and logic 0. A memory switching circuit 10 switchably selects a memory address of the input connection switching information memory 8 on the basis of the input connection switching control signal Sci to switch one memory area to another memory area in which switching information for another grouping state is stored. In order to change the connection, the switching information can instantaneously be changed by switching the memory area. Thus, the connection can be switched at a high speed.

Figure 6:
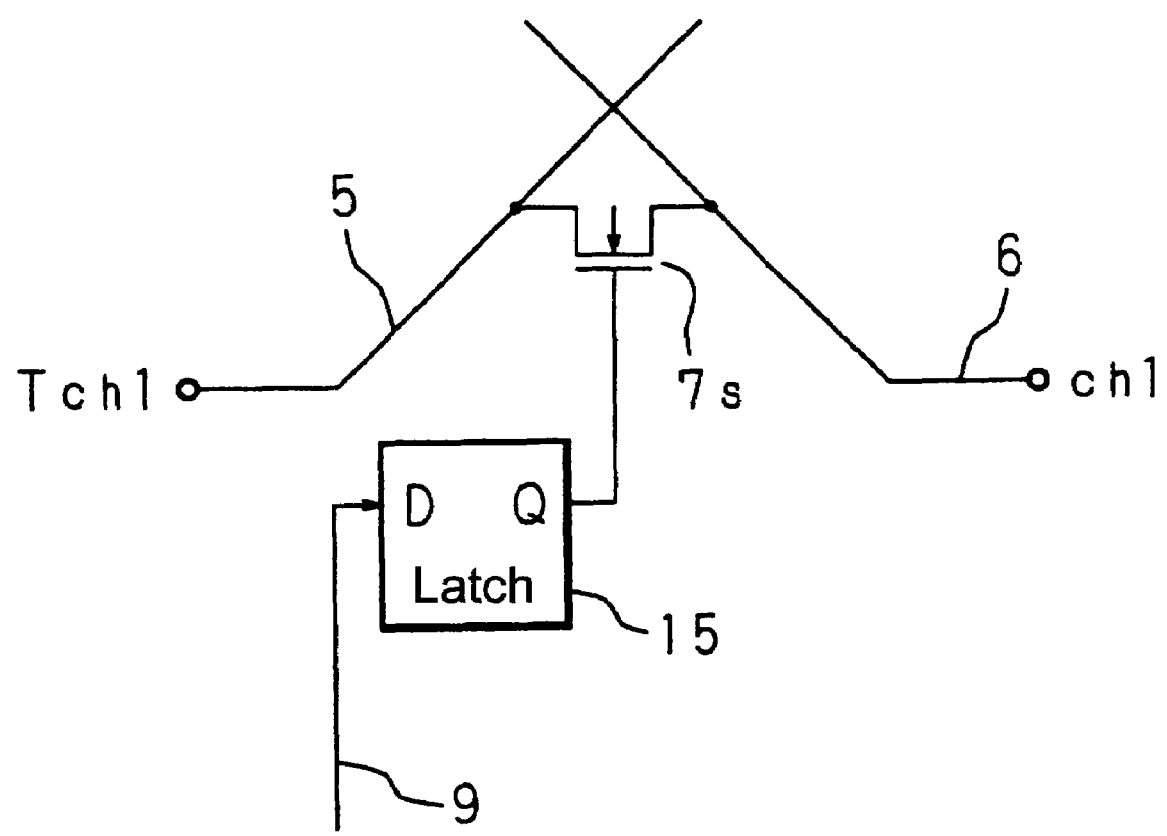
FIG. 6 is a circuit diagram illustrating the circuit configuration of a switch.

FIG. 6 is a circuit diagram illustrating the circuit configuration of the switch. The switch 7s is connected to the common test signal output line 5 and the original test signal input line 6 at the opposite ends thereof for switching the connection of the common test signal output line 5 with the original test signal input line 6. The switch 7s is constituted, for example, by a MOS transistor, which is controlled by an output of a latch circuit 15 inputted to the gate thereof. The latch circuit 15 controls the switching of the switch 7s by holding the switching information applied thereto from the input connection switching information memory 8 via the switch selection signal line 9. If the output Q of the latch circuit 15 assumes logic 1, the switch 7s is closed to establish the connection between the common test signal output line 5 and the original test signal input line 6, so that the common test signal output terminal Tch1 and the input terminal ch1, for example, are connected to each other. If the output Q of the latch circuit 15 assumes logic 0, the switch 7s is opened to cut the connection between the common test signal output line 5 and the original test signal input line 6, so that the common test signal output terminal Tch1 and the input terminal ch1, for example, are not connected to each other.

SECOND EMBODIMENT

Figure 7:
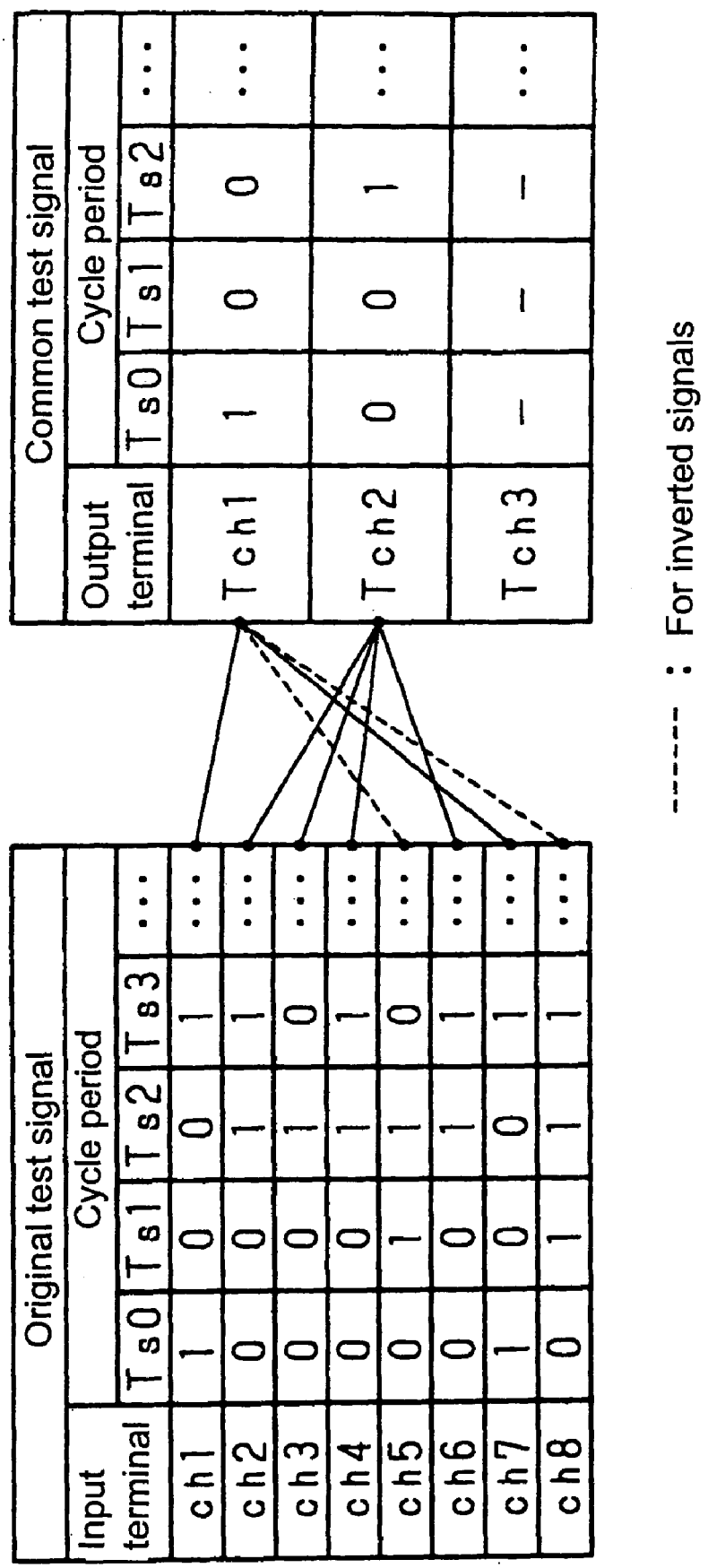
FIG. 7 is a diagram for explaining a relationship of original test signals and their inverted signals with common test signals in accordance with a second embodiment of the present invention.

FIG. 7 is a diagram for explaining a relationship of original test signals and their inverted signals with common test signals in accordance with a second embodiment of the present invention. Although the input terminals ch1 to ch8 of the CUT 4 are grouped on the basis of the logic states of the original test signals to share the common test signal output terminals Tch1 to Tch3 of the common test signal generating circuit 2 in the first embodiment, the input terminals ch1 to ch8 of the CUT 4 are grouped on the basis of the logic states of the original test signals and the inverted signals of the original test signals to share the common test signal output terminals Tch1 to Tch3 of the common test signal generating circuit 2 in the second embodiment. FIG. 7 illustrates the results of the grouping based on the original test signals and the inverted signals of the original test signals when the original test signals shown in FIG. 2 are to be inputted. In the cycle periods Ts0 to Ts2, the original test signals for the input terminals ch1 and ch7 of the CUT 4 are at logic 100. The original test signals for the input terminals ch5 and ch8 are at logic 011 and, hence, the inverted signals of the original test signals for the input terminals ch5 and ch8 are at logic 100. Where the inverted signals are taken into account, the input terminals ch1 and ch7 and the input terminals ch5 and ch8 are classified into the same group to share the common test signal output terminal Tch1. Further, the original test signals for the input terminals ch2, ch3, ch4 and ch6 are at logic 001, so that the input terminals ch2, ch3, ch4 and ch6 share the common test signal output terminal Tch2. The number of the common test signal output terminals to be shared is reduced to two (Tch1 and Tch2) as compared with the case shown in FIG. 2. Hence, there is no need to use the common test signal output terminal Tch3 in the cycle periods Ts0 to Ts2. Therefore, the terminal sharing can be achieved by employing a reduced number of terminals as compared with the case shown in FIG. 2. That is, input terminals having the same logic state on an inverted or non-inverted basis are classified into the same group, so that the terminal sharability can be increased twice for the reduction of the number of the terminals.

FIG. 8 is a diagram for explaining a method for grouping the input terminals as shown in FIG. 7. The grouping method according to the second embodiment is basically the same as the grouping method according to the first embodiment (FIG. 4), so that duplication of the explanation will be avoided. In FIG. 8, some of the reference characters are not shown for simplification. The input terminals ch1 to ch8 and imaginary input terminals (inverted input terminals) CH1 to CH8 (which are intended to mean the inversion of the terminals ch1 to ch8) for the inverted signals of the original test signals are grouped on the basis of the logic states of the original test signals and the logic states of the inverted signals of the original test signals, and the resulting input terminal groups are associated with the common test signal output terminals Tch1 to Tch3. Thus, the original test signals (input test pattern) to be inputted to the input terminals ch1 to ch8 are converted into the common test signals, which are in turn outputted from the common test signal output terminals Tch1 to Tch3. That is, the inverted input terminals CH1 to CH8 are also included in the first set of input terminals to be grouped. In this case, the common target terminal number N is set to be twice the number of the common test signal output terminals (Tch1 to Tch3).

In the cycle period Ts0, there are two logic states, i.e., logic 0 and logic 1. A group assuming logic 1 and a group assuming logic 0 in the cycle period Ts0 are denoted by Gr1 and Gr0, respectively. The input terminals ch1 and ch7 and the inverted input terminals CH2, CH3, CH4, CH5, CH6 and CH8 are classified into the group Gr1, and the input terminals ch2, ch3, ch4, ch5, ch6 and ch8 and the inverted input terminals CH1 and CH7 are classified into the group Gr0. At this time point, the number n of the groups is two.

The input terminals and the inverted input terminals in each of the groups are further grouped in the same manner as in the first embodiment. The grouping is sequentially repeated until the number n of the groups resulting from the grouping of the input terminals ch1 to ch8 and the inverted input terminals CH1 to CH8 exceeds a number twice the number of the common test signal output terminals Tch1 to Tch3 of the common test signal generating circuit 2 (also referred to as "common target terminal number N", which is N=6). When the number n of the groups exceeds the number twice the number of the common test signal output terminals Tch1 to Tch3 of the common test signal generating circuit 2, groups provided immediately before the last grouping of the input terminals and the inverted input terminals are associated with the common test signal output terminals of the common test signal generating circuit 2 for the generation of the common test signals.

Since the input terminals ch1 to ch8 and the inverted input terminals CH1 to CH8 are classified into the four groups (n=4) on the basis of the logic states thereof in the cycle periods Ts0 to Ts2, the input terminals ch1 to ch8 and the inverted input terminals CH1 to CH8 are further grouped on the basis of the logic states thereof in the cycle period Ts3. In the cycle periods Ts0 to Ts3, the input terminals ch1 and ch7 and the inverted input terminal CH5 are classified into a group Gr1001, and the inverted input terminal CH8 is classified into a group Gr1000. The inverted input terminal CH3 is classified into a group Gr1101, and the inverted input terminals CH2, CH4 and CH6 are classified into a group Gr1100. The input terminals ch2, ch4 and ch6 are classified into a group Gr0011, and the input terminal ch3 is classified into a group Gr0010. The input terminal ch5 and the inverted input terminals CH1 and CH7 are classified into a group Gr0110, and the input terminal ch8 is classified into a group Gr0111. At this time point, the number n of the groups are eight. Since the group number n exceeds the common target terminal number N (N=6), the groups provided immediately before the last grouping (i.e., the four groups provided by the grouping of the input terminals (ch1 to ch8) and the inverted input terminals (CH1 to CH8) in the cycle periods Ts0 to Ts2) are associated with the common test signal output terminals Tch1 to Tch3 to generate the common test signals. The four groups are not in one-to-one correspondence with the three common test signal output terminals (Tch1 to Tch3). However, some of the four groups including the inverted signals are equivalent, so that there are virtually two groups as will be described below.

In the cycle periods Ts0 to Ts2, the groups Gr100, Gr110, Gr001 and Gr011 are provided, so that the group number n is four. The input terminals ch1 and ch7 and the inverted input terminals CH5 and CH8 are classified into the group Gr100, and the inverted input terminals CH2, CH3, CH4 and CH6 are classified into the group Gr110. The input terminals ch2, ch3, ch4 and ch6 are classified into the group Gr001, and the input terminals ch5 and ch8 and the inverted input terminals CH1 and CH7 are classified into the group Gr011. As a result of the grouping carried out with the inverted signals taken into account, some of the groups contain inverted signals. Therefore, equivalent groups having inverted logic states are present. The group Gr011 is equivalent to the group Gr100 with inverted logic states. Further, the group Gr110 is equivalent to the group Gr001. By removing the equivalent groups from the groups finally provided, the group Gr100 is associated with the common test signal output terminal Tch1, and the group Gr001 is associated with the common test signal output terminal Tch2. Thus, the original test signals and the inverted signals of the original test signals for the eight input terminals ch1 to ch8 are converted into the common test signals, which are in turn outputted from the two common test signal output terminals Tch1 and Tch2 of the three common test signal output terminals Tch1 to Tch3. Thus, the number of the terminals can equivalently be reduced for the generation of the common test signals.

As described above, the second embodiment (FIGS. 7 and 8) involving the grouping of the inverted signals is more effective for the reduction of the number of the terminals than the first embodiment (FIGS. 2 and 4). In the case of FIG. 7 (FIG. 8), for example, the input terminals ch5 and ch8 can be classified into the same group as the input terminals ch1 and ch7 when the inverted signals are taken into consideration to select the inverted input terminals CH5 and CH8. Therefore, the number of the common test signal output terminals of the common test signal generating circuit 2 can be reduced to two (Tch1, Tch2). Thus, further reduction of the number of the terminals can be achieved as compared with the first embodiment which employs the three common test signal output terminals Tch1 to Tch3.

The computation and processing amount may be reduced in the following manner. The first grouping is based on both logic 0 and logic 1 in the case shown in FIG. 8, but it is theoretically possible to carry out the first grouping on the basis of either logic 0 or logic 1 when the inverted signals are taken into consideration.

In the first grouping, input terminals assuming different logic states are necessarily classified into different groups. Therefore, the first grouping is carried out on the basis of either logic 0 or logic 1 in an actual computation thereby to obviate the need for the final equivalent group removing step. In this case, there is no need to double the common target terminal number (group number) N.

FIG. 9 is a block diagram illustrating, in detail, the input connection switching circuit for realizing the relationship shown in FIG. 7. The input connection switching circuit has substantially the same basic construction as that according to the first embodiment (FIG. 5), so that duplication of the explanation will be avoided. An inversion common test signal output line 5R is branched from each of the common test signal output lines 5 for outputting the common test signals via an inverter 16 which inverts the common test signal. Either the common test signal output line 5 or the inversion common test signal output line 5R can be connected to the corresponding original test signal input line 6. Where the group corresponding to the common test signal output terminal Tch1 includes input terminals (ch1 to ch8) grouped on the basis of the logic states of the original test signals and inverted input terminals (CH1 to CH8) grouped on the basis of the logic state of the inverted signals of the original test signals, for example, the input terminals (ch1 to ch8) grouped on the basis of the logic states of the original test signals are connected to the corresponding original test signal input lines 6 via the corresponding common test signal output line 5, and the inverted input terminals (CH1 to CH8) grouped on the basis of the logic states of the inverted signals of the original test signals are connected to the corresponding original test signal input lines 6 via the corresponding inversion common test signal output line SR. This arrangement makes it possible to use the inverted signals. Alternatively, the input terminals (ch1 to ch8) may be connected to the corresponding original test signal input lines 6 via the corresponding inversion common test signal output line 5R, and the inverted input terminals (CH1 to CH8) may be connected to the corresponding original test signal input lines 6 via the corresponding common test signal output line 5.

Two-bit switching signals for controlling the connections of the common test signal output lines 5 and the inversion common test signal output lines 5R with the original test signal input lines 6 are applied to the switches 7s from the input connection switching information memory 8 via the switch selection signal lines 9 for switching the switches 7s. The input connection switching information memory 8 has a 3×8×2-bit basic configuration for storing 2-bit switching information for controlling the connections of the common test signal output lines 5 and the inversion common test signal output lines 5R with the original test signal input lines 6.

Figure 10:
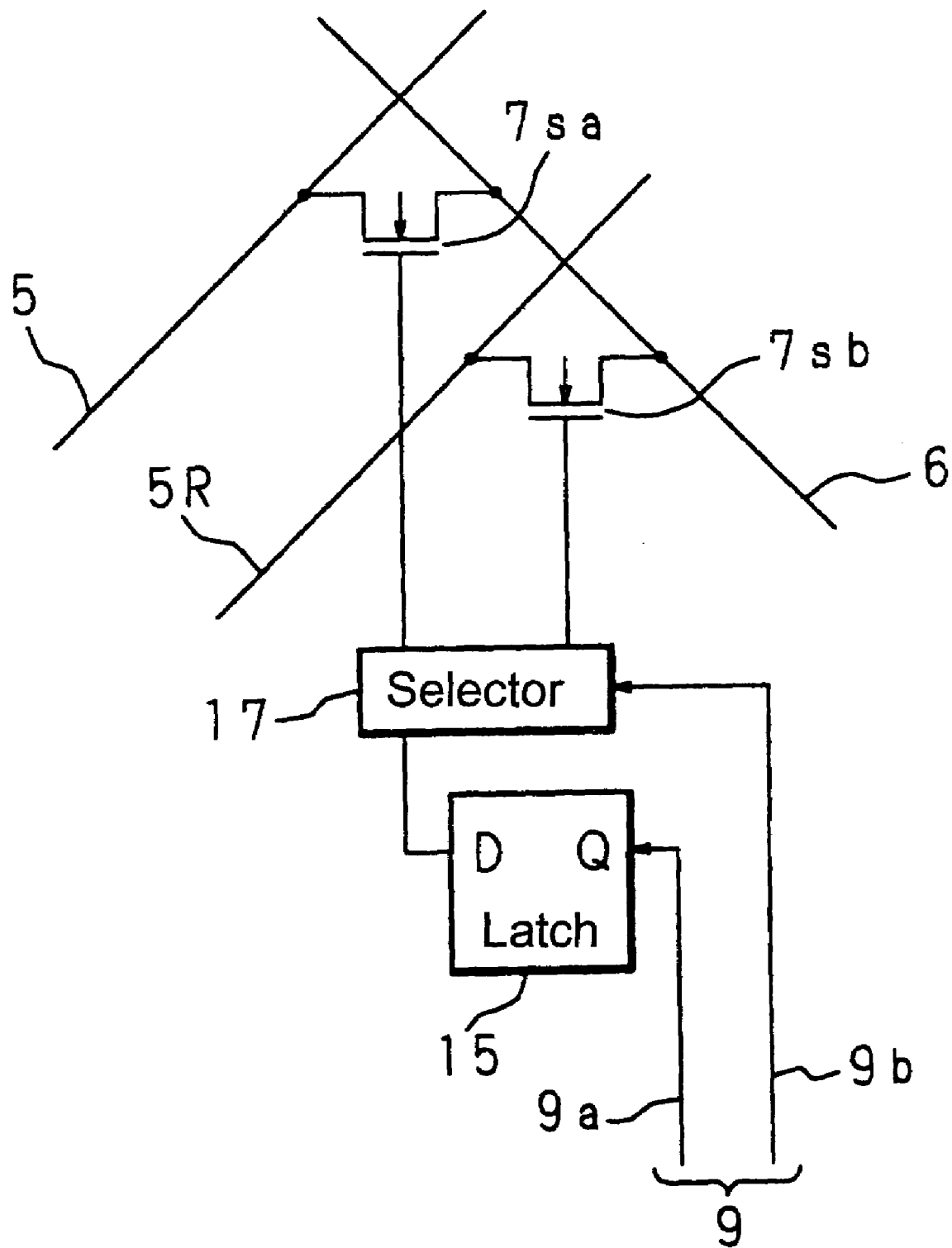
FIG. 10 is a circuit diagram illustrating the circuit configuration of a switch shown in FIG. 9.

FIG. 10 is a circuit diagram illustrating the circuit configuration of the switch shown in FIG. 9. The switch 7s has substantially the same basic configuration as that according to the first embodiment (FIG. 6), so that duplication of the explanation will be avoided. The switch 7s includes a switch 7sa and a switch 7sb, which are each constituted by an analog switch of a MOS transistor. Therefore, 48 analog switches are provided in total. The switch 7sa switches the connection of the common test signal output line 5 with the original test signal input line 6, while the switch 7sb switches the connection of the inversion common test signal output line 5R with the original test signal input line 6. The switch selection signal line 9 includes a latch signal line 9a and a selector signal line 9b. Switching information is inputted to a latch circuit 15 via the latch signal line 9a, and selector information for the switch 7sa and the switch 7sb is inputted to a selector 17 via the selector signal line 9b, whereby the switch 7sa and the switch 7sb are controlled to be switched.

In the second embodiment, the logic inversion is applied to the terminal sharing on the input side. The logic inversion may be applied to the terminal sharing on the output side as in the following third embodiment. Even in this case, the same effects can be provided.

THIRD EMBODIMENT

Figure 11:
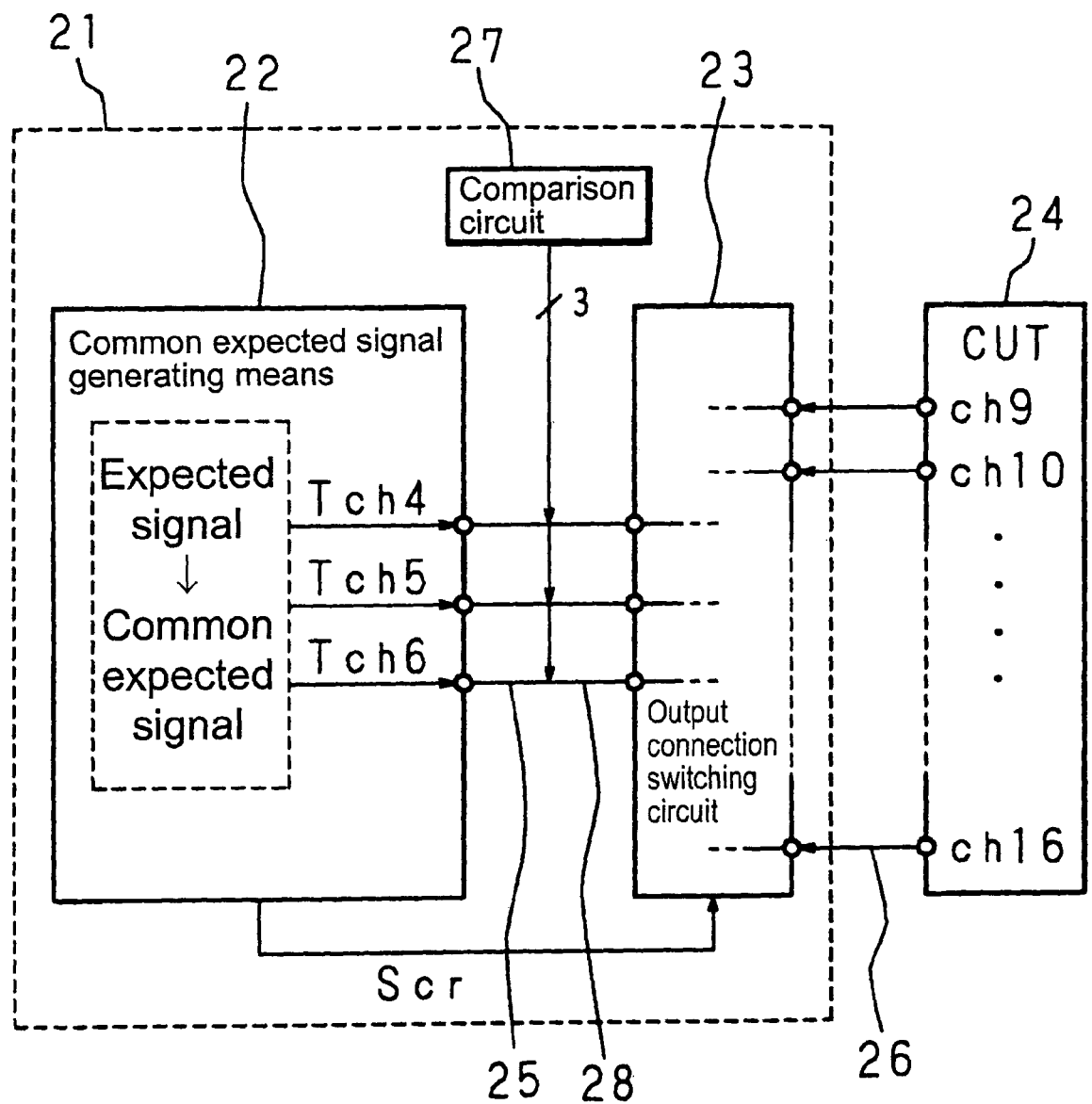
FIG. 11 is a block diagram schematically illustrating a test apparatus according to a third embodiment of the present invention.

FIG. 11 is a block diagram schematically illustrating a test apparatus according to the third embodiment of the present invention. A logic circuit test apparatus 21 (hereinafter referred to as "tester 21") is adapted to test a logic circuit 24 (hereinafter referred to as "CUT 24") having a plurality of input terminals (not shown) and a plurality of output terminals (eight output terminals ch9 to ch16 in this embodiment) by inputting original test signals to the input terminals of the CUT 24 and testing output signals from the output terminals ch9 to ch16 of the CUT 24. The tester 21 includes a common expected signal generating circuit 22, an output connection switching circuit 23 and a comparison circuit 27. The common expected signal generating circuit 22 is adapted to group the output terminals ch9 to ch16 of the CUT 24 on the basis of logic states of expected signals (output test pattern) to be outputted from the output terminals ch9 to ch16, generate common expected signals for expected signal output terminals (three expected signal output terminals Tch4 to Tch6 in this embodiment) smaller in number than the output terminals ch9 to ch16 of the CUT 24 by sharing the expected signal output terminals Tch4 to Tch6 of the common expected signal generating circuit 22, and output the common expected signals from the expected signal output terminals Tch4 to Tch6. The common expected signals are inputted to the comparison circuit 27 via common expected signal output lines 25. With the provision of the output connection switching circuit 23, the tester 21 having the expected signal output terminals Tch4 to Tch6 (for the common expected signals) smaller in number than the output terminals ch9 to ch16 of the CUT 24 is capable of reproducing the expected signals with high fidelity for the test.

The output connection switching circuit 23 is adapted to switch connections of output signal measurement signal lines 28 as output signal measurement terminals for the expected signal output terminals Tch4 to Tch6 of the common expected signal generating circuit 22 with output signal output lines 26 extending from the output terminals ch9 to ch16 of the CUT 24 in accordance with the grouping on the basis of an output connection switching control signal Scr supplied thereto from the common expected signal generating circuit 22. Thus, the output signals from the output terminals ch9 to ch16 are outputted from the output signal measurement terminals (output signal measurement signal lines 28) as common output signals to be compared with the common expected signals, and inputted to the comparison circuit 27 via the output signal measurement signal lines 28.

The comparison circuit 27 is adapted to compare the common expected signals with the common output signals for the test for determination of the acceptability of the CUT 24. That is, the comparison circuit 27 compares the levels of the output signals of the output terminals ch9 to ch16 of the CUT 24 with the levels of the expected signals prepared for the original test signals to determine whether the output signals match the expected signals (with a predetermined allowance), whereby the tester 21 determines the acceptability on the basis of the result. The original test signals to be inputted to the input terminals of the CUT 24 may be tested by terminal sharing (according to the first embodiment) to be carried out in the same manner as on the output side, or without the terminal sharing.

Figure 12:
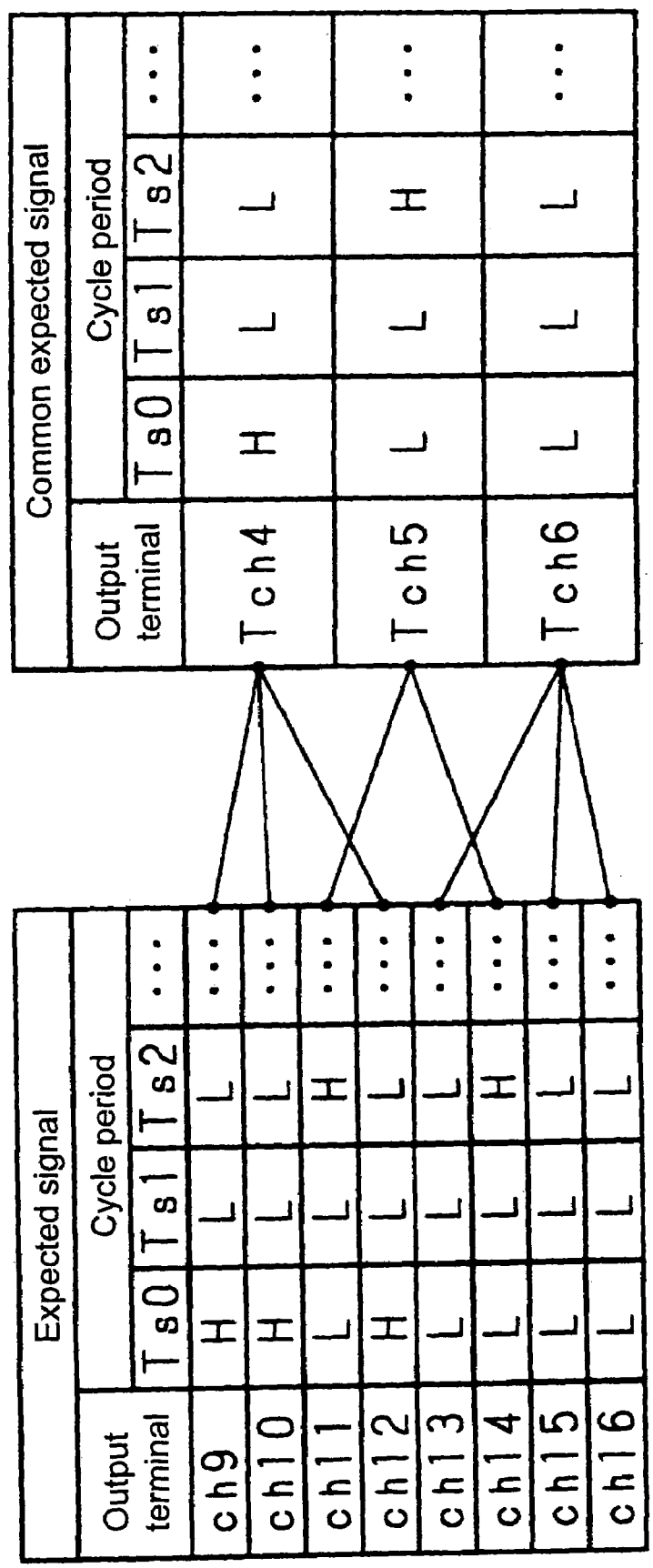
FIG. 12 is a diagram for explaining a relationship between expected signals and common expected signals in the apparatus shown in FIG. 11.

FIG. 12 is a diagram for explaining a relationship between the expected signals and the common expected signals in the apparatus shown in FIG. 11. The relationship is basically the same as that according to the first embodiment (FIG. 2). The logic states are indicated by logic H and logic L for sharing the output terminals ch9 to ch16 of the CUT 24 (i.e., for the output terminals). In the cycle periods Ts0 to Ts2, the output terminals ch9, ch10 and ch12 of the CUT 24 are grouped together to be associated with the expected signal output terminal Tch4 of the common expected signal generating circuit 22, and the output terminals ch11 and ch14 are grouped together to be associated with the expected signal output terminal Tch5. The output terminals ch13, ch15 and ch16 are grouped together to be associated with the expected signal output terminal Tch6. Thus, the expected signal output terminals Tch4 to Tch6 are each shared on a group basis.

Figure 13:
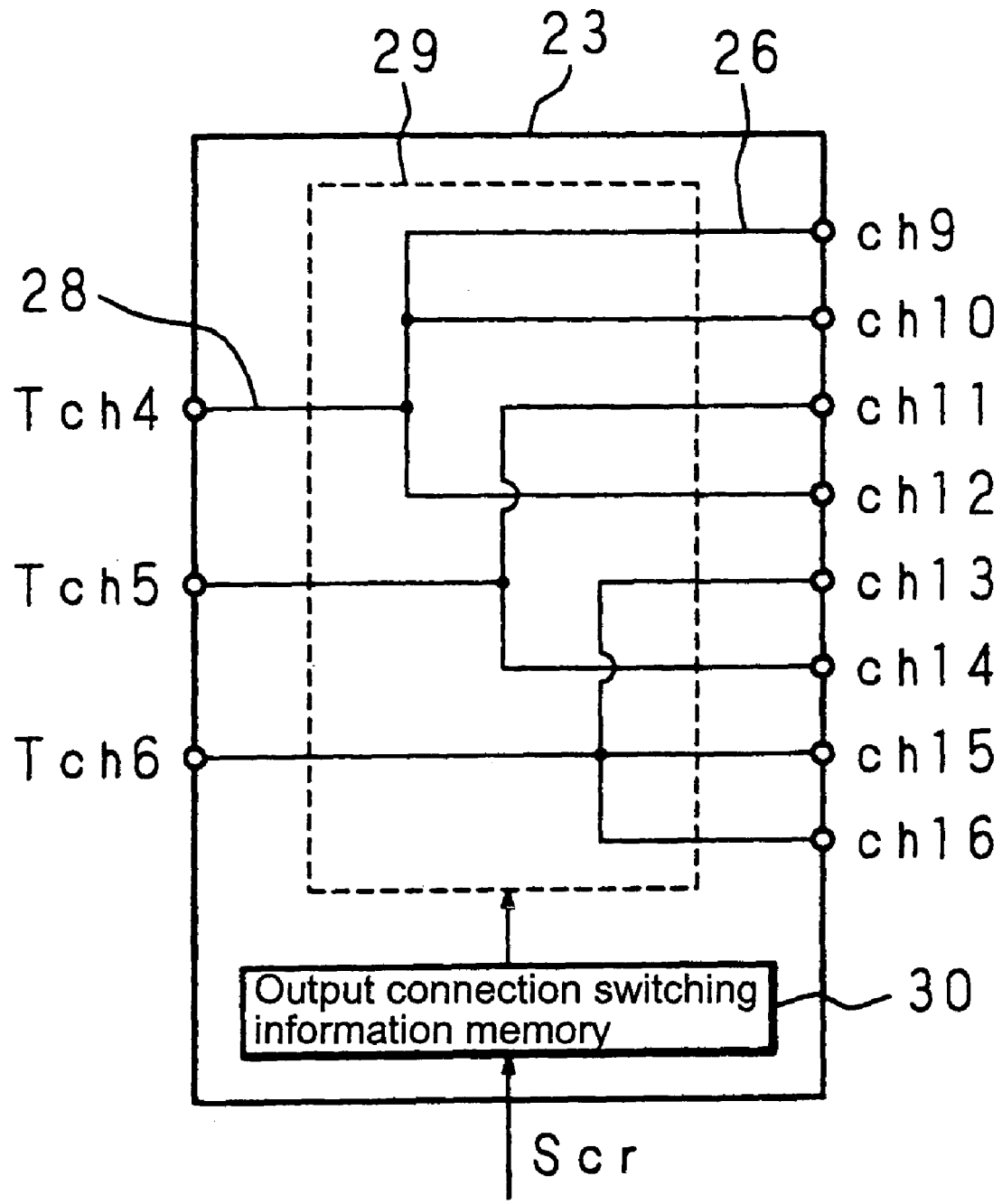
FIG. 13 is a block diagram schematically illustrating an output connection switching circuit shown in FIG. 11.

FIG. 13 is a block diagram schematically illustrating the output connection switching circuit of the apparatus shown in FIG. 11. The output connection switching circuit has substantially the same basic construction as the input connection switching circuit (FIG. 3) in the first embodiment. The output connection switching circuit 23 includes an output connection switching block 29 connected to the output signal measurement signal lines 28 for the expected signal output terminals Tch4 to Tch6 of the common expected signal generating circuit 22 and to the output signal lines 26 extending from the output terminals ch9 to ch16 of the CUT 24. The output connection switching block 29 is controlled for switching on the basis of the content of an output connection switching information memory 30. The output connection switching information memory 30 is controlled on the basis of the output connection switching control signal Scr. For simplification, the connections in the cycle periods Ts0 to Ts2 in FIG. 12 are herein illustrated as fixed lines. For simplification of the explanation, terminals assuming the same logic state are herein illustrated as simply connected to the same expected signal output terminal. In an actual circuit, the connections are achieved by analog adders or the like. Logic H or L is assigned to each of the output signals from the output terminals ch9 to ch16 of the CUT 24 on the basis of whether or not the level of the output signal falls within an allowance of the expected level (1 or 0).

Figure 14:
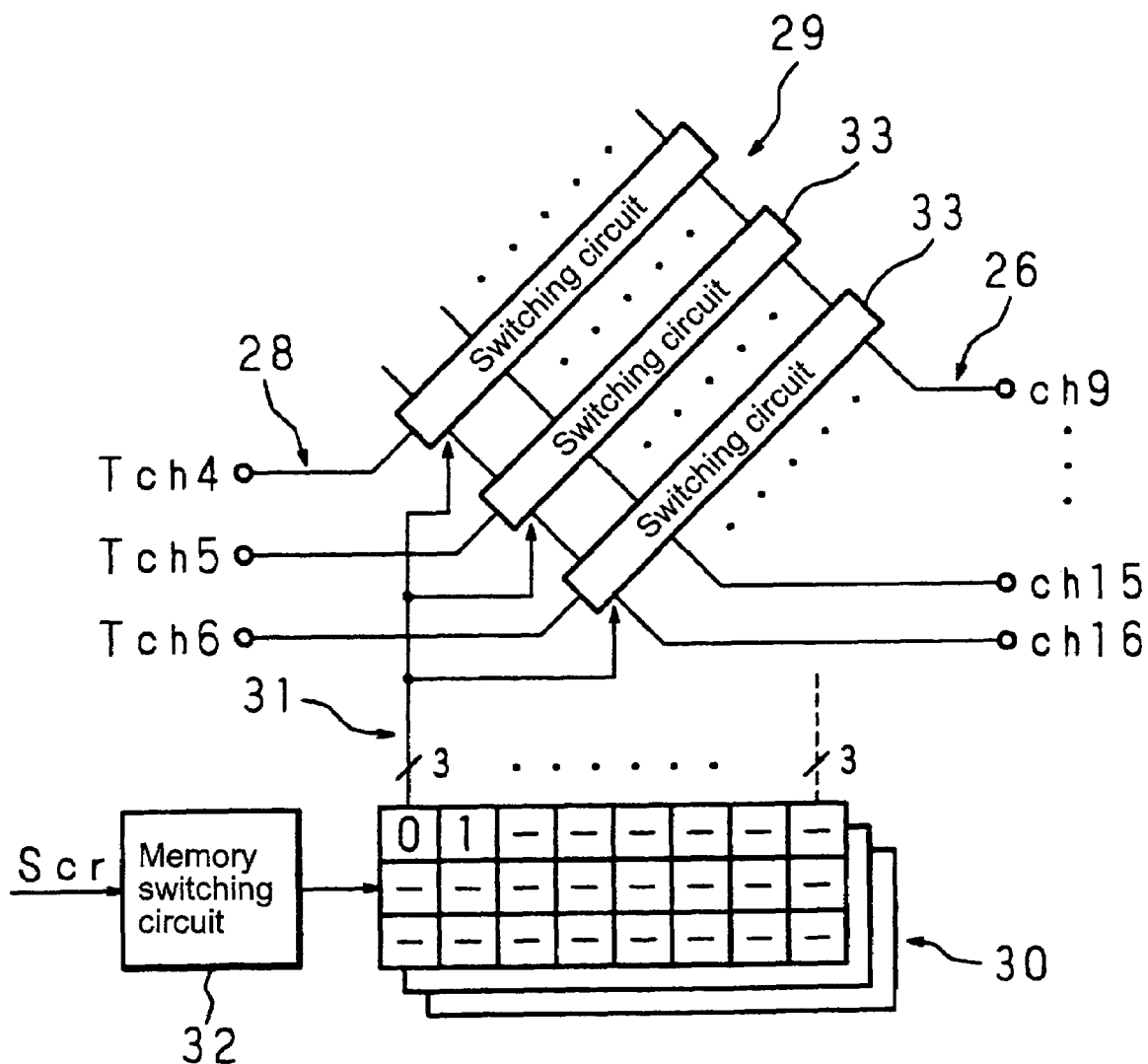
FIG. 14 is a block diagram illustrating the output connection switching circuit of FIG. 13 in detail.

FIG. 14 is a block diagram illustrating the output connection switching circuit of FIG. 13 in detail. The output connection switching circuit has substantially the same basic construction as the input connection switching circuit (FIG. 5) in the first embodiment. The output connection switching block 29 includes switch circuits 33 for controlling the connections between the eight output signal output lines 26 and the three output signal measurement signal lines 28. The switch circuits 33 are provided in association with the output signal measurement signal lines 28, and connected to the output signal output lines 26 at input ends thereof and to the output signal measurement signal lines 28 at output ends thereof. The switch circuits 33 are respectively disposed along the output signal measurement signal lines 28, and intersect the output signal output lines 26 in a matrix configuration. The switch circuits 33 each receive a switching signal (opening/closing signal) applied thereto according to a memory content from the output connection switching information memory 30 via a switch selection signal line 31 thereby to be switched for opening and closing thereof. The output connection switching information memory 30 has substantially the same configuration as the input connection switching information memory 8 and, therefore, will not be described in detail. The connections between the output signal output lines 26 and the output signal measurement signal lines 28 are switched by the switching of the switch circuits 33. A memory switching circuit 32 switchably selects a memory address of the output connection switching information memory 30 on the basis of the output connection switching control signal Scr to switch a memory area to another memory area in which switching information for another grouping state is stored. In order to change the connection, the switching information can instantaneously be changed by switching the memory area. Thus, the connection can be switched at a high speed.

Figure 15:
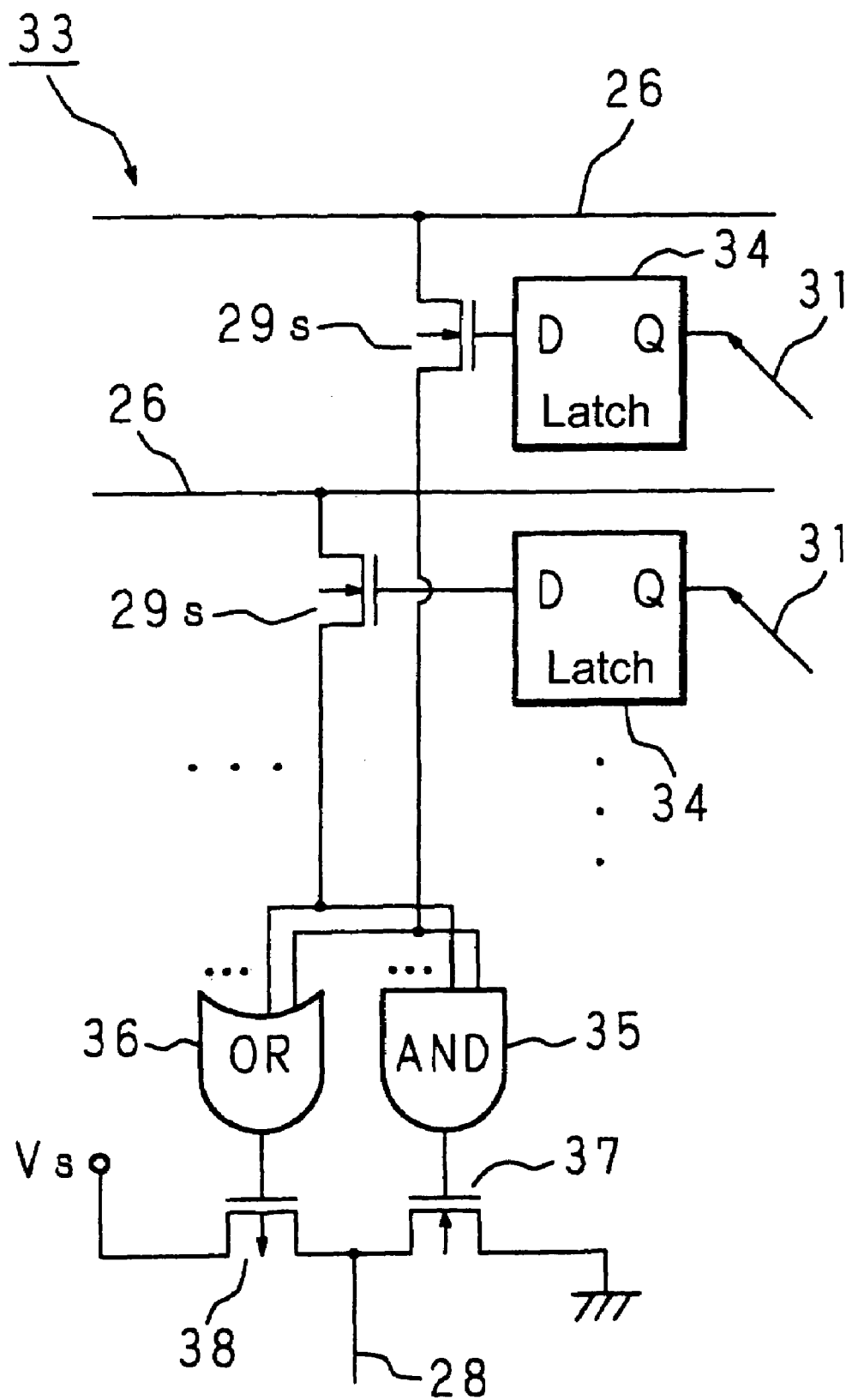
FIG. 15 is a circuit diagram illustrating the circuit configuration of a switch circuit.

FIG. 15 is a circuit diagram illustrating the circuit configuration of the switch circuit. The switch circuit has substantially the same basic configuration as that according to the first embodiment (FIG. 6). The switch circuit 33 includes switches 29s provided in associated with the respective output signal output lines 26. The switches 29s are each constituted by an analog switch (e.g., a MOS transistor), which is controlled by an output of a latch circuit 34 inputted to the gate thereof. The latch circuit 34 controls the switching of the switch 29s by holding switching information applied thereto from the output connection switching information memory 30 via the switch selection signal line 31. That is, the switch circuit 33 is operative in basically the same manner as in the case shown in FIG. 6. The switch 29s is connected to the output signal output line 26 at one end thereof, and to an AND circuit 35 and an OR circuit 36 at the other end thereof. Outputs of the AND circuit 35 and the OR circuit 36 are connected to a gate electrode of a transistor 37 and a gate electrode of a transistor 38, respectively. The transistor 37 is an n-channel MOS transistor, and has a source electrode grounded and a drain electrode connected to a drain electrode of the transistor 38. The transistor 38 is a p-channel MOS transistor, and has a source electrode connected to a power source Vs. The drain electrodes of the transistor 37 and the transistor 38 are connected to the output signal measurement signal line 28.

When the output signals of the output terminals ch9 to ch16 of the CUT 24 are tested, the output signal measurement signal lines 28 connected for logic judgment should output logic L if the output signals of the output terminals ch9 to ch16 all assume logic L, and output logic H if the output signals of the output terminals ch9 to ch16 all assume logic H. If logic L and logic H are simultaneously present in the outputs from the output terminals of the CUT adapted to output only logic L and logic H (if the CUT 24 is defective), it may be possible to detect the simultaneous presence of logic L and logic H (defective CUT) by setting a proper judgment level by means of an analog adder. However, the detection of the defective CUT is impossible with simple connections by means of the logic circuits.

The switch circuit 33 is adapted to output a logic L signal from the output signal measurement signal line 28 when ALL "H" is outputted from the CUT 24, and output a logic H signal from the output signal measurement signal line 28 when ALL "L" is outputted from the CUT 24. Further, the switch circuit 33 is adapted to output a high impedance signal when logic H and logic L are simultaneously present. In the case of ALL "L", the transistor 37 is turned off with the output of the AND circuit 35 kept at L, and the transistor 38 is turned on with the output of the OR circuit 36 kept at L. Therefore, the logic H signal is outputted from the output signal measurement signal line 28. In the case of ALL "H", the transistor 38 is turned off with the output of the OR circuit 36 kept at H, and the transistor 37 is turned on with the output of the AND circuit 35 kept at H. Therefore, the logic L signal is outputted from the output signal measurement signal line 28. In the other case, the transistor 37 and the transistor 38 are turned off with the output of the OR circuit 36 kept at H and with the output of the AND circuit 35 kept at L, and the high impedance signal is outputted from the output signal measurement signal line 28.

FOURTH EMBODIMENT

The logic circuit test apparatus 1 according to the first embodiment and the logic circuit test apparatus 21 according to the third embodiment are combined to provide a more effective logic circuit test apparatus. In this case, the logic circuit test apparatus includes a connection switching control circuit (not shown) for synchronizing the input connection switching circuit 3 and the output connection switching circuit 23. The connection switching control circuit is adapted to synchronously control the input connection switching control signal Sci and the output connection switching control signal Scr. Further, the grouping of the terminals may be achieved by employing the logic inverted signals as in the second embodiment.

FIFTH EMBODIMENT

Figure 16:
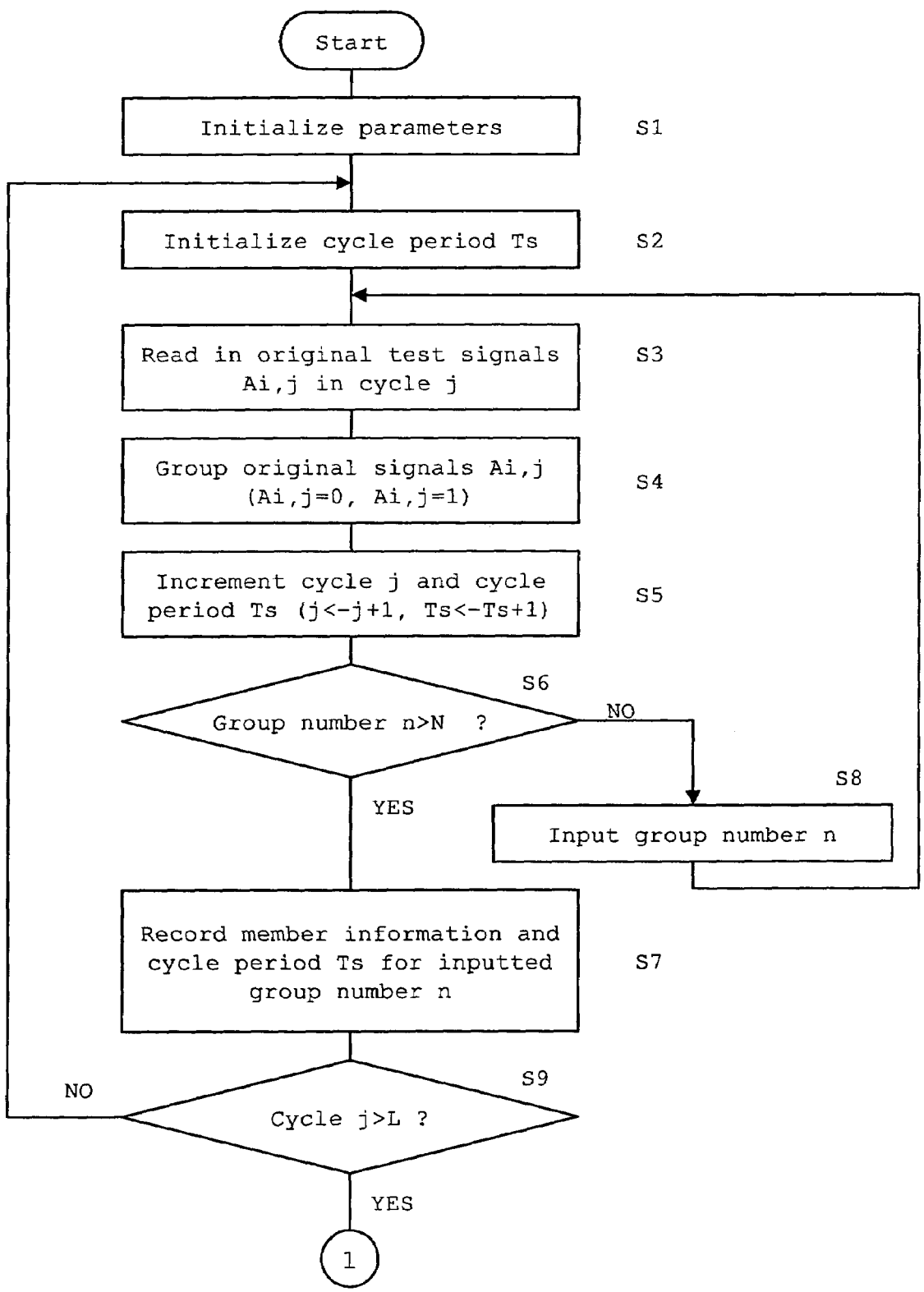
FIG. 16 is a flow chart for explaining a common test signal generating method.
Figure 17:
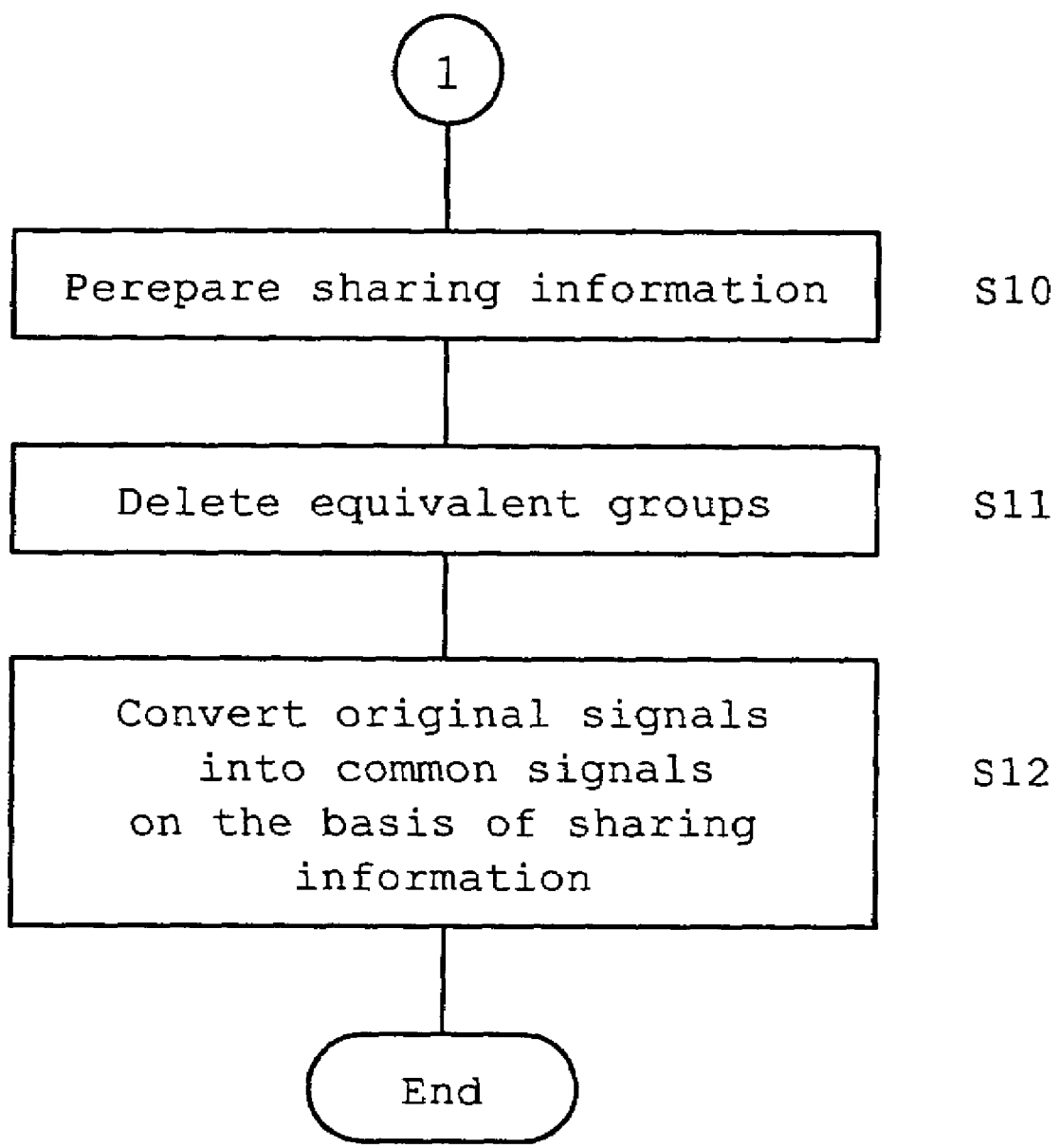
FIG. 17 is a flow chart for explaining the common test signal generating method.

FIGS. 16 and 17 are flow charts for explaining a common test signal generating method. A term "common test signal" is herein intended to mean both the common test signal in the first embodiment and the common expected signal in the third embodiment. That is, the common test signals are applicable to both the input terminals and the output terminals of the logic circuit (4, 24) under test. The logic circuit test apparatus (1, 21) utilizing the common test signals can test the logic circuit (4, 24) even if having terminals smaller in number than the input terminals and the output terminals of the logic circuit (4, 24). The processing operation can be performed in the same manner on the input side and on the output side. Therefore, the input terminals and the output terminals are herein simply expressed as "terminals" without discrimination therebetween, and the input signals and the output signals are herein simply expressed as "signals" without discrimination therebetween, unless otherwise required to be discriminated. Specifically, the common test signal generating method is based on the first embodiment (FIG. 4).

First, parameters are initialized (S1). For example, a cycle j (=0), a last test cycle L, a group number n (=0), a common target terminal number N, a maximum number P of terminals of the logic circuit under test, original test signals Ai,j and the like are specified. The original test signals Ai,j are signals applied before the reduction of the number of the terminals. The cycle j is a set of segment periods (cycle periods Ts), and means a total cycle period from the start to the end of the test. The cycle j satisfies a relationship $0 \leq j < L$. The cycle periods Ts are determined so that the number of the terminals is reduced to not greater than the common target terminal number N by sharing the terminals to provide blocks (segments) of signals for the reduced number of terminals in the cycle periods. A number i in the signal Ai,j denotes a terminal number, and satisfies a relationship $0 \leq i < P$.

Then, the cycle period Ts is initialized (S2). This means that the cycle period starts from the cycle period Ts0. The original test signals Ai,j in the cycle j are read in (S3). The original test signals Ai,j are grouped on the basis of the logic states thereof (S4). Original test signals Ai,j assuming logic 1 (logic H) are classified in a group (Ai,j=0), and original test signals Ai,j assuming logic 0 (logic L) are classified in a group (Ai,j=1). After every grouping, the cycle j and the cycle period Ts are incremented (S5). That is, j is replaced with j+1, and Ts is replaced with Ts+1.

Next, it is determined whether the group number n exceeds the common target terminal number N (S6). If YES, member information (terminal numbers belonging to each of the groups) and the value of the cycle period Ts for the inputted group number n (the number n of groups stored in the previous grouping) are recorded (S7). A set of terminals grouped together for terminal sharing is referred to as a segment. If NO, the group number n is inputted (the group number n is stored) (S8), and the process returns to Step S3 to repeat the grouping in the next cycle period.

It is determined whether the cycle j exceeds the maximum test cycle L (S9). If NO, the process returns to Step S2. If YES, sharing information is prepared (S10). That is, terminal sharing information for each segment is prepared on the basis of the recorded member information and the value of the cycle period Ts. Then, equivalent groups provided by the grouping based on the logic inversion are deleted (S11). An operation for setting the common target terminal number for the grouping based on the logic inversion is performed in the same manner as in the second embodiment. The original test signals are converted into the common test signals on the basis of the sharing information (S12). The original test signals are herein intended to mean the original test signals in the first embodiment and the expected signals in the third embodiment.

Figure 18:
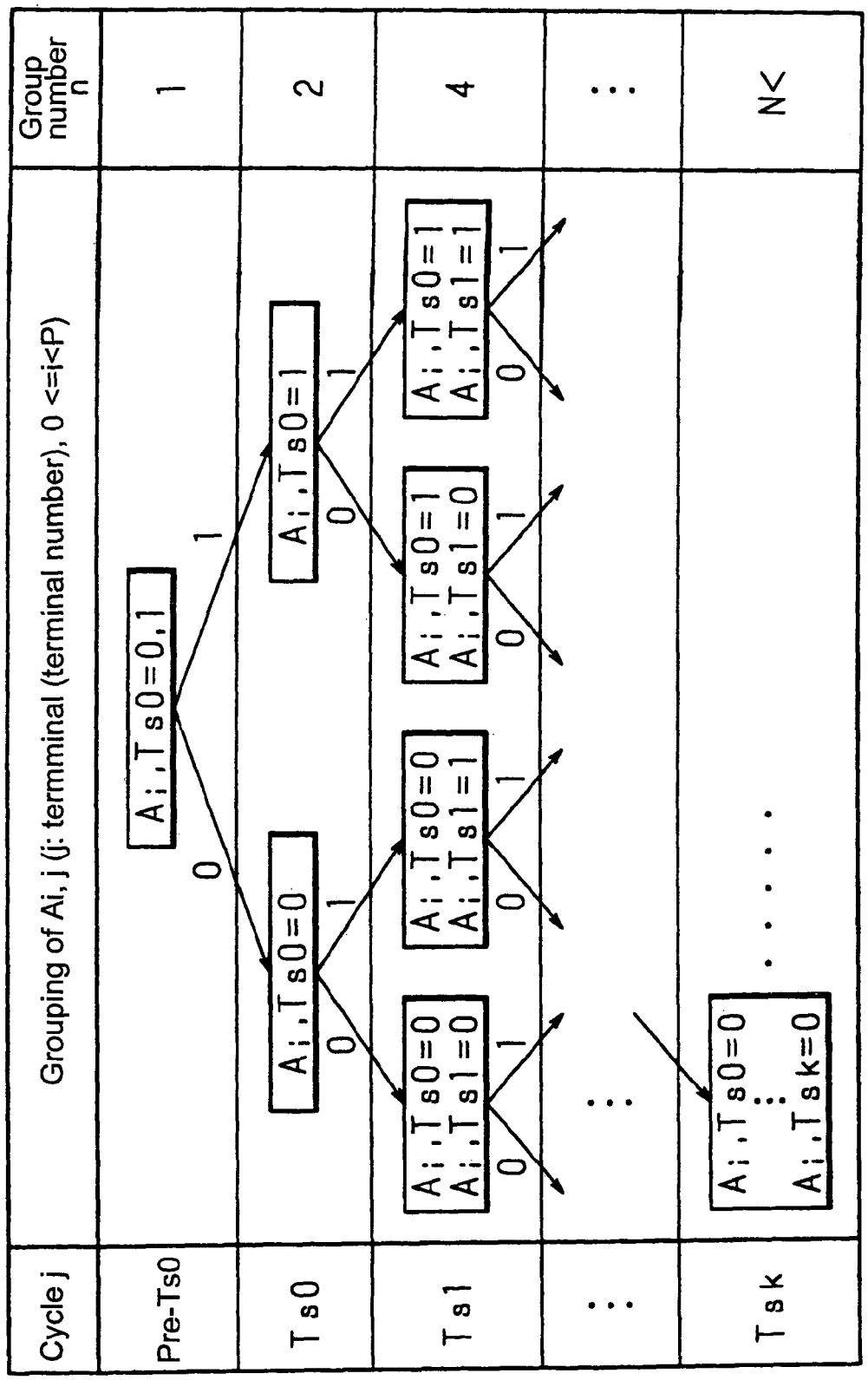
FIG. 18 is a schematic diagram for explaining a grouping operation performed for generation of common test signals.
Figure 19:
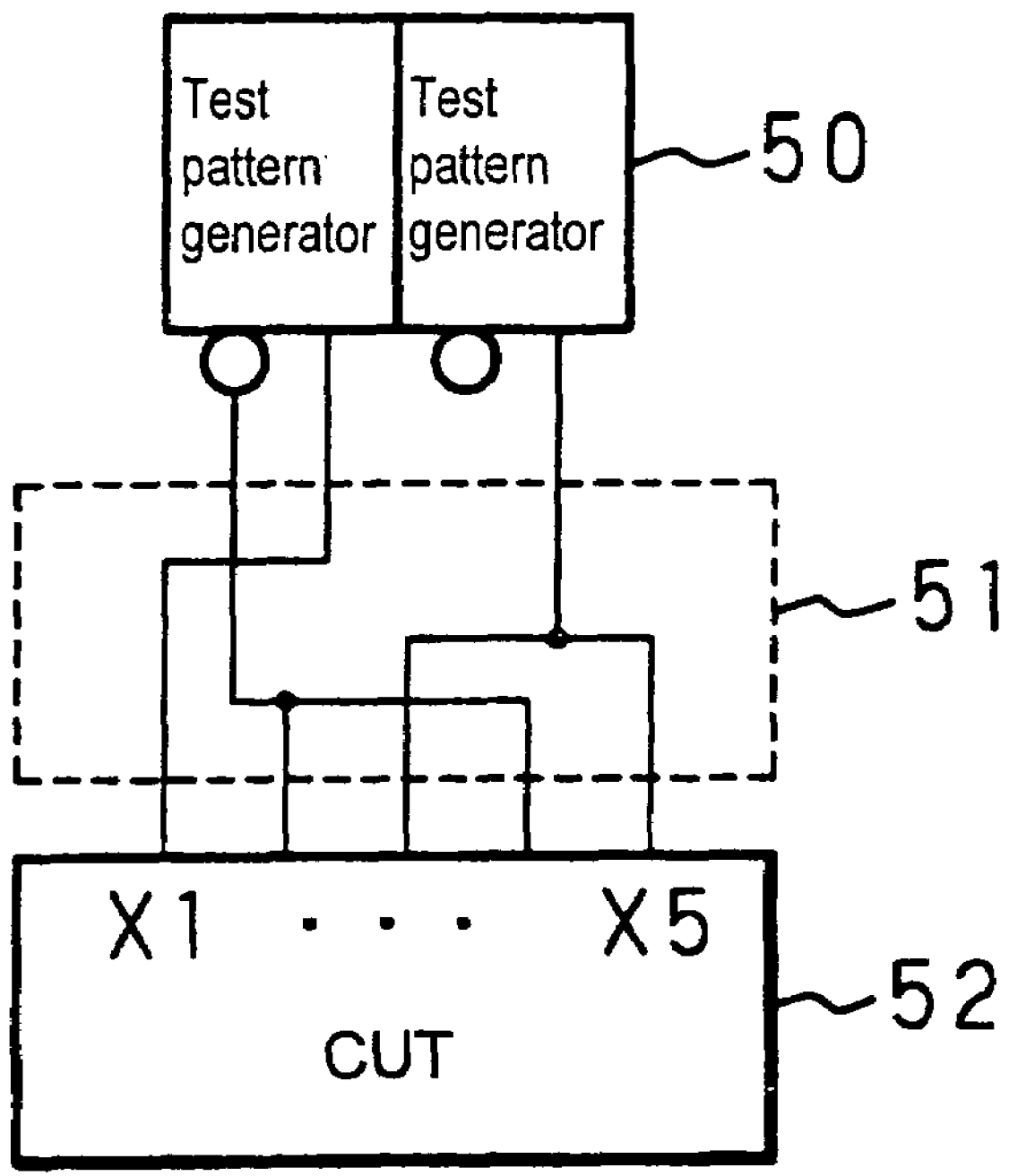
FIG. 19 is a block diagram for explaining an example of a conventional method for reducing the number of input terminals.
Figure 20:
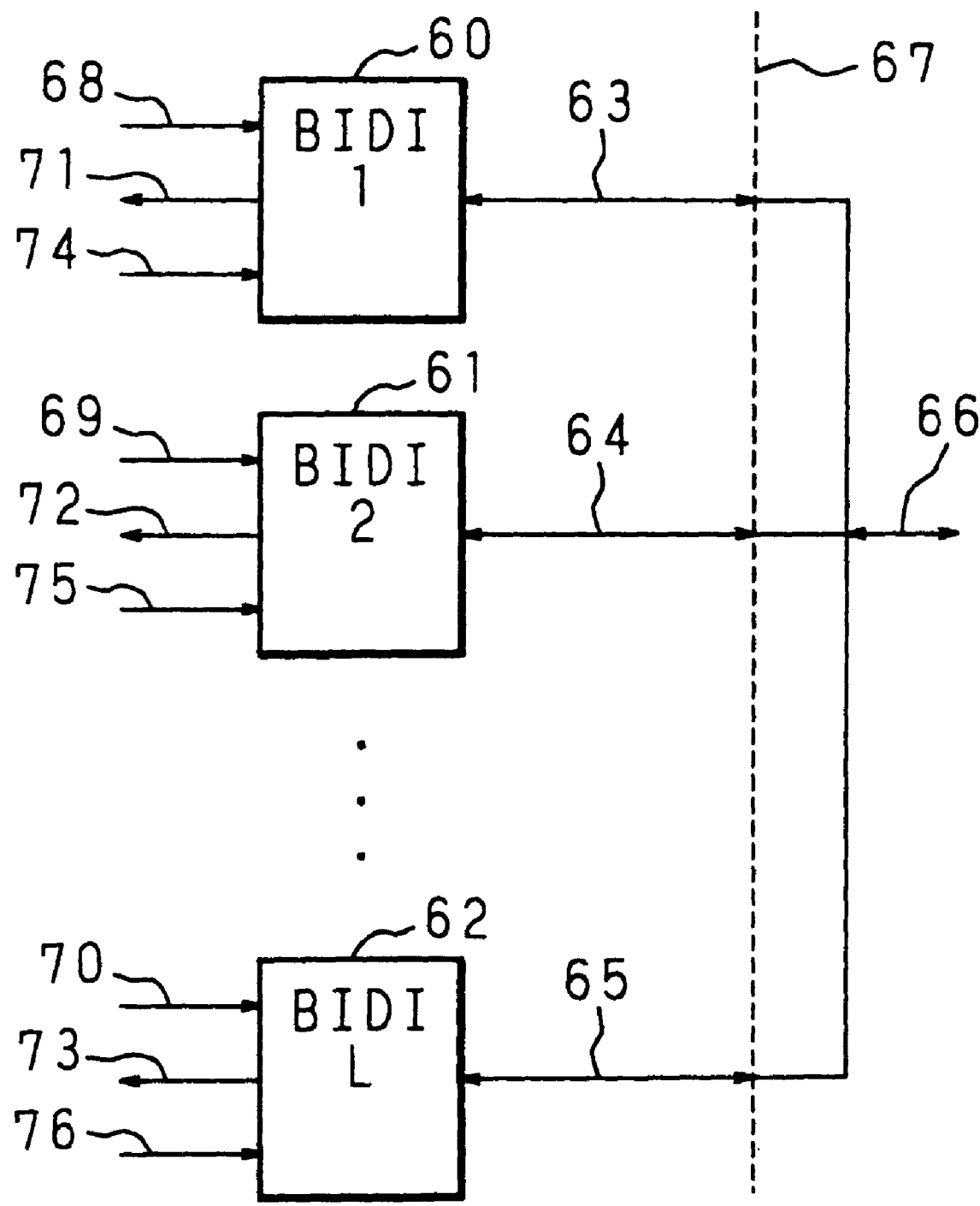
FIG. 20 is a block diagram for explaining an example of a conventional method for reducing the number of input and output terminals.

FIG. 18 is a schematic diagram for explaining the grouping operation performed in the generation of the common test signals. In FIG. 18, the original test signals Ai,j are grouped on the basis of the logic states thereof (logic 1, logic 0), and the methods according to the first embodiment (FIG. 4) and the second embodiment (FIG. 8) are generalized. A character i denotes a terminal (terminal number), which has a relationship $0 \leq i < P$. The cycle j is the cycle of the entire test pattern, and the entire cycle is j=L. A pre-Ts0 cycle period is a period before the original test signals Ai,j are grouped in the cycle period Ts0. In the pre-Ts0 cycle period, the original test signals Ai,j have j=Ts0, and are represented by Ai,Ts0. Before the grouping, the group number n is n=1, and logic 0 and logic 1 are simultaneously present in the group. Cycle periods Ts0 to Tsk are cycle periods (segment periods) which permit the terminals of the original terminal number P to be classified into groups of the common terminal number N. Depending on the states of the original test signals; the segment period Ts may be maintained in the next cycle j (k→k+1: cycle period Tsk+1) and the subsequent cycle period, and the segment period Ts may be varied from the cycle period Ts0 to the cycle period Tsh.

In the cycle period Ts0, the original test signals Ai,j are classified into a logic 0 group (Ai,Ts0=0) and a logic 1 group (Ai,Ts0=1), and the group number n is 2. In the cycle period Ts1, the original test signals in the respective groups provided in the pre-Ts0 cycle period are further classified into four groups, i.e., into a group (Ai,Ts0=0/Ai,Ts1=0), a group (Ai,Ts0=0/Ai,Ts1=1), a group (Ai,Ts0=1/Ai,Ts1=0) and a group (Ai,Ts0=1/Ai,Ts1=1), on the basis of the logic states of the original test signals Ai,Ts1 in the cycle period Ts1. The terminal sharing is carried out on the basis of the states of the terminals in the respective groups provided in the cycle period Tsk−1 before the cycle period Tsk in which the group number n exceeds the common terminal number N. After the cycle period Tsk, the grouping for Ts0, Ts1, . . . is repeated over the entire cycle j=L.

According to the present invention, the common test signals equivalent to the input test pattern (original test signals) can be outputted from the common test signal output terminals smaller in number than the input terminals of the logic circuit, or the common expected signals equivalent to the output test pattern (expected signals) can be outputted from the expected signal output terminals smaller in number than the output terminals of the logic circuit for the test of the logic circuit. Thus, even the logic circuit test apparatus having a smaller number of terminals can perform the test with the use of the test pattern equivalent to the original test pattern.

According to the present invention, even if the logic circuit test apparatus having terminals smaller in number than the terminals of the logic circuit is employed for the test of the logic circuit, the logic circuit test method ensures that the test can be performed with the use of the test pattern equivalent to the original test pattern.

What is claimed is:

1. A logic circuit test apparatus for testing a logic circuit having a plurality of input terminals and a plurality of output terminals by inputting original test signals to the input terminals of the logic circuit and testing output signals from the output terminals of the logic circuit, the logic circuit test apparatus comprising:
   a common test signal generating circuit which groups the input terminals of the logic circuit on the basis of logic states of original test signals to be applied to the respective input terminals of the logic circuit and outputs common test signals from common test signal output terminals thereof smaller in number than the input terminals of the logic circuit;
   an input connection switching circuit which switches connections of the common test signal output terminals of the common test signal generating circuit with the input terminals of the logic circuit so as to convert the common test signals into the original test signals and apply the original test signals to the input terminals of the logic circuit;
   a common expected signal generating circuit which groups the output terminals of the logic circuit on the basis of logic states of expected signals to be outputted from the respective output terminals of the logic circuit in association with the original test signals and outputs common expected signals from expected signal output terminals thereof smaller in number than the output terminals of the logic circuit;
   an output connection switching circuit which switches connections of the output terminals of the logic circuit with output signal measurement terminals provided in a one-to-one correspondence with the expected signal output terminals of the common expected signal generating means so as to compare the output signals outputted from the respective output terminals of the logic circuit with the common expected signals; and
   a connection switching control circuit for synchronously controlling the input connection switching circuit and the output connection switching circuit.

2. A logic circuit test apparatus for testing a logic circuit having a plurality of input terminals and a plurality of output terminals by inputting original test signals to the input terminals of the logic circuit and testing output signals from the output terminals of the logic circuit, the logic circuit test apparatus comprising:
   a common test signal generating circuit which groups the input terminals of the logic circuit on the basis of logic states of original test signals to be applied to the respective input terminals of the logic circuit and outputs common test signals from common test signal output terminals thereof smaller in number than the input terminals of the logic circuit; and
   an input connection switching circuit which switches connections of the common test signal output terminals of the common test signal generating circuit with the input terminals of the logic circuit so as to convert the common test signals into the original test signals and apply the original test signals to the respective input terminals of the logic circuit.

3. A logic circuit test apparatus as set forth in claim 2, wherein the common test signal generating circuit groups the input terminals on the basis of the logic states of the original test signals and logic states of inverted signals obtained by logic inversion of the original test signals to generate the common test signals.

4. A logic circuit test apparatus as set forth in claim 2, wherein the input connection switching circuit comprises an input connection switching information memory for switching the connections, the memory storing therein input connection switching information necessary for switching the connections of the common test signal output terminals of the common test signal generating circuit with the input terminals of the logic circuit.

5. A logic circuit test apparatus for testing a logic circuit having a plurality of input terminals and a plurality of output terminals by inputting original test signals to the input terminals of the logic circuit and testing output signals from the output terminals of the logic circuit, the logic circuit test apparatus comprising:
   a common expected signal generating circuit which groups the output terminals of the logic circuit on the basis of logic states of expected signals to be outputted from the respective output terminals of the logic circuit in association with the original test signals and outputs common expected signals from expected signal output terminals thereof smaller in number than the output terminals of the logic circuit; and
   an output connection switching circuit which switches connections of the output terminals of the logic circuit with output signal measurement terminals provided in a one-to-one correspondence with the expected signal output terminals of the common expected signal generating circuit so as to compare the output signals outputted from the respective output terminals of the logic circuit with the common expected signals.

6. A logic circuit test apparatus as set forth in claim 5, wherein the common expected signal generating circuit groups the output terminals of the logic circuit on the basis of the logic states of the expected signals and logic states of inverted expected signals obtained by logic inversion of the expected signals to generate the common expected signals.

7. A logic circuit test apparatus as set forth in claim 5, wherein the output connection switching circuit comprises an output connection switching information memory for switching the connections, the memory storing therein output connection switching information necessary for switching the connections of the output terminals of the logic circuit with the output signal measurement terminals.

8. A logic circuit test method for testing a logic circuit having a plurality of input terminals and a plurality of output terminals by inputting original test signals to the input terminals of the logic circuit and testing output signals from the output terminals of the logic circuit, the logic circuit test method comprising the steps of:
   grouping the input terminals of the logic circuit on the basis of logic states of original test signals to be applied to the respective input terminals of the logic circuit, further grouping the grouped input terminals on the basis of logic states of the original test signals in the next cycle period, and sequentially repeating the grouping of the input terminals until the number of input terminal groups exceeds the number of common test signal output terminals of a common test signal generating circuit smaller than the number of the input terminals of the logic circuit so as to output common test signals from the common test signal output terminals of the common test signal generating circuit; and
   when the number of the groups exceeds the number of the common test signal output terminals of the common test signal generating circuit, generating the common test signals for corresponding respective input terminal groups provided immediately before the last grouping to the common test signal output terminals of the common test signal generating circuit.

9. A logic circuit test method as set forth in claim 8, wherein the common test signal generating circuit groups the input terminals on the basis of the logic states of the original test signals and logic states of inverted signals obtained by logic inversion of the original test signals, repeats the grouping until the number of input terminal groups exceeds a number twice the number of the common test signal output terminals of the common test signal generating circuit and, when the number of the groups exceeds the number twice the number of the common test signal output terminals of the common test signal generating circuit, generates the common test signals for corresponding respective input terminal groups obtained by removing equivalent groups from input terminal groups provided immediately before the last grouping to the common test signal output terminals of the common test signal generating circuit.

10. A logic circuit test method for testing a logic circuit having a plurality of input terminals and a plurality of output terminals by inputting original test signals to the input terminals of the logic circuit and testing output signals from the output terminals of the logic circuit, the logic circuit test method comprising the steps of:
    grouping the output terminals of the logic circuit on the basis of logic states of expected signals to be outputted from the respective output terminals of the logic circuit in association with the original test signals, further grouping the grouped output terminals on the basis of logic states of the expected signals in the next cycle period, and sequentially repeating the grouping of the output terminals until the number of output terminal groups exceeds the number of expected signal output terminals of a common expected signal generating circuit smaller than the number of the output terminals of the logic circuit so as to output common expected signals from the expected signal output terminals of the common expected signal generating circuit; and
    when the number of the groups exceeds the number of the expected signal output terminals of the common expected signal generating circuit, generating the common expected signals for corresponding respective output terminal groups provided immediately before the last grouping to the expected signal output terminals of the common expected signal generating circuit.

11. A logic circuit test method as set forth in claim 10, wherein the common expected signal generating circuit groups the output terminals of the logic circuit on the basis of the logic states of the expected signals and logic states of inverted signals obtained by logic inversion of the expected signals, sequentially repeats the grouping until the number of output terminal groups exceeds a number twice the number of the expected signal output terminals of the common expected signal generating circuit and, when the number of the groups exceeds the number twice the number of the expected signal output terminals of the common expected signal generating circuit, generates the common expected signals for corresponding output terminal groups obtained by removing equivalent groups from output terminal groups provided immediately before the last grouping to the expected signal output terminals of the common expected signal generating circuit.

12. A logic circuit test method for testing a logic circuit having a plurality of input terminals and a plurality of output terminals by inputting original test signals to the input terminals of the logic circuit and testing output signals from the output terminals of the logic circuit, the logic circuit test method comprising the steps of:

grouping the input terminals of the logic circuit on the basis of logic states of original test signals to be applied to the input terminals of the logic circuit, further grouping the grouped input terminals on the basis of logic states of the original test signals in the next cycle period, and sequentially repeating the grouping of the input terminals until the number of input terminal groups exceeds the number of common test signal output terminals of a common test signal generating circuit smaller than the number of the input terminals of the logic circuit so as to output common test signals from the common test signal output terminals of the common test signal generating circuit;

when the number of the groups exceeds the number of the common test signal output terminals of the common test signal generating circuit, generating the common test signals for corresponding respective input terminal groups provided immediately before the last grouping to the common test signal output terminals of the common test signal generating circuit;

grouping the output terminals of the logic circuit on the basis of logic states of expected signals to be outputted from the respective output terminals of the logic circuit in association with the original test signals, further grouping the grouped output terminals on the basis of logic states of the expected signals in the next cycle period, and sequentially repeating the grouping of the output terminals until the number of output terminal groups exceeds the number of expected signal output terminals of a common expected signal generating circuit smaller than the number of the output terminals of the logic circuit so as to output common expected signals from the expected signal output terminals of the common expected signal generating circuit; and when the number of the groups exceeds the number of the expected signal output terminals of the common expected signal generating circuit, generating the common expected signals for corresponding respective output terminal groups provided immediately before the last grouping to the expected signal output terminals of the common expected signal generating circuit.

* * * * *